US012813233B2

(12) United States Patent
Wu et al.

(10) Patent No.: US 12,813,233 B2
(45) Date of Patent: Nov. 24, 2026

(54) METHOD OF FORMING SEMICONDUCTOR-ON-INSULATOR (SOI) SUBSTRATE

(71) Applicant: Taiwan Semiconductor Manufacturing Company, Ltd., Hsin-Chu (TW)

(72) Inventors: Cheng-Ta Wu, Shueishang Township (TW); Kuan-Liang Liu, Pingtung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 291 days.

(21) Appl. No.: 17/854,750

(22) Filed: Jun. 30, 2022

(65) Prior Publication Data

US 2022/0336265 A1 Oct. 20, 2022

Related U.S. Application Data

(62) Division of application No. 16/812,533, filed on Mar. 9, 2020, now Pat. No. 11,710,656.
(Continued)

(51) Int. Cl.
*H01L 21/762* (2006.01)
*H01L 21/84* (2006.01)
(Continued)

(52) U.S. Cl.
CPC ........... *H10P 90/191* (2026.01); *H10D 86/01* (2025.01); *H10D 86/201* (2025.01); *H10W 10/181* (2026.01)

(58) Field of Classification Search
CPC ............... H01L 21/322; H01L 21/3221; H01L 21/3223; H01L 21/02002; H01L 21/324;
(Continued)

(56) References Cited

U.S. PATENT DOCUMENTS 4,376,657 A * 3/1983 Nagasawa ........... H01L 21/3225
257/E21.321
5,011,794 A 4/1991 Grim et al.
(Continued)

FOREIGN PATENT DOCUMENTS

JP 109283529 A 10/1997
KR 20100036155 A 4/2010

OTHER PUBLICATIONS

Final Office Action dated Jun. 13, 2022 for U.S. Appl. No. 16/812,533.
(Continued)

*Primary Examiner* — Leonard Chang
*Assistant Examiner* — Stanetta D Isaac
(74) *Attorney, Agent, or Firm* — Eschweiler & Potashnik, LLC

(57) ABSTRACT

The present disclosure, in some embodiments, relates to a semiconductor structure. The semiconductor structure includes a handle substrate having a plurality of bulk macro defects (BMDs). An insulating layer is disposed onto a top surface of the handle substrate. A device layer, including a semiconductor material, is disposed onto the insulating layer. The handle substrate has a first denuded region and a second denuded region that vertically surround a central region of the handle substrate. The central region has a higher concentration of the plurality of BMDs than both the first denuded region and the second denuded region.

20 Claims, 12 Drawing Sheets

Related U.S. Application Data

(60) Provisional application No. 62/907,960, filed on Sep. 30, 2019.

(51) Int. Cl.

| | |
|---|---|
| ***H01L 27/12*** | (2006.01) |
| ***H10D 86/00*** | (2025.01) |
| ***H10D 86/01*** | (2026.01) |
| ***H10P 90/00*** | (2026.01) |
| ***H10W 10/10*** | (2026.01) |

(58) Field of Classification Search

CPC ........... H01L 21/3225; H01L 21/76245; H01L 21/76251; H01L 21/2007; H01L 21/3226; H01L 21/76256; H01L 21/7624; H10D 86/01; H10D 86/201; H10P 90/191; H10P 90/1922; H10P 90/00; H10P 90/1914; H10P 90/1906; H10P 36/07; H10P 36/20; H10P 95/90; H10W 10/181

See application file for complete search history.

(56) References Cited

U.S. PATENT DOCUMENTS

| | | | | |
|---|---|---|---|---|
| 5,597,410 | A * | 1/1997 | Yen | H01L 21/2007 438/977 |
| 8,729,673 | B1 | 5/2014 | Okandan et al. | |
| 10,395,974 | B1 | 8/2019 | Chou et al. | |
| 2001/0030348 | A1 | 10/2001 | Falster | |
| 2003/0008435 | A1 * | 1/2003 | Falster | H01L 21/76243 257/E21.32 |
| 2004/0142542 | A1 | 7/2004 | Murphy et al. | |
| 2005/0250297 | A1 * | 11/2005 | Shive | H01L 21/3221 257/E21.321 |
| 2006/0138601 | A1 | 6/2006 | Seacrist et al. | |
| 2009/0203167 | A1 | 8/2009 | Mitani | |
| 2010/0038755 | A1 | 2/2010 | Park et al. | |
| 2010/0078767 | A1 | 4/2010 | Park | |
| 2011/0183445 | A1 | 7/2011 | Hanaoka et al. | |
| 2012/0329242 | A1 * | 12/2012 | Hanaoka | H01L 21/02238 438/460 |
| 2014/0273291 | A1 | 9/2014 | Huang et al. | |
| 2015/0056784 | A1 | 2/2015 | Schulze et al. | |
| 2017/0110420 | A1 | 4/2017 | Cheng et al. | |
| 2019/0122921 | A1 * | 4/2019 | Moll | H01L 21/28052 |
| 2020/0058746 | A1 * | 2/2020 | Wu | H10D 64/118 |

OTHER PUBLICATIONS

Non-Final Office Action dated Nov. 25, 2022 for U.S. Appl. No. 16/812,533.

Brunner et al. “Characterization of Wafer Geometry and Overlay Error on Silicon Wafers With Nonuniform Stress.” J. Micro/Nanolith. MEMS MOEMS 12(4), 043002 (Oct.-Dec. 2013), published on Oct. 25, 2013.

Sheng, James J. “Surfactant-Polymer Flooding.” Modern Chemical Enhanced Oil Recovery, Gulf Professional Publishing, pp. 371-387, ISBN 9781856177450, published in 2011.

Lee et al. “Analysis of Fine Bulk Micro Defects in Denuded Zone of Silicon Wafer.” Abstract #2078, 218th ECS Meeting, @ 2010 The Electrochemical Society, published in 2010.

Semilab. “Defect Inspection.” The date of publication is unknown. Retrieved online on Sep. 26, 2019 from https://semilab.com/category/products/light-scattering-tomography.

Non-Final Office Action dated Sep. 16, 2021 for U.S. Appl. No. 16/812,533.

* cited by examiner

METHOD OF FORMING SEMICONDUCTOR-ON-INSULATOR (SOI) SUBSTRATE

REFERENCE TO RELATED APPLICATIONS

This Application is a Divisional of U.S. application Ser. No. 16/812,533, filed on Mar. 9, 2020, which claims the benefit of U.S. Provisional Application number 62/907,960, filed on Sep. 30, 2019. The contents of the above-referenced Patent Applications are hereby incorporated by reference in their entirety.

BACKGROUND

Integrated circuits have traditionally been formed on bulk semiconductor substrates. In recent years, semiconductor-on-insulator (SOI) substrates have emerged as an alternative to bulk semiconductor substrates. An SOI substrate comprises a handle substrate, an insulating layer over the handle substrate, and a device layer over the insulating layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
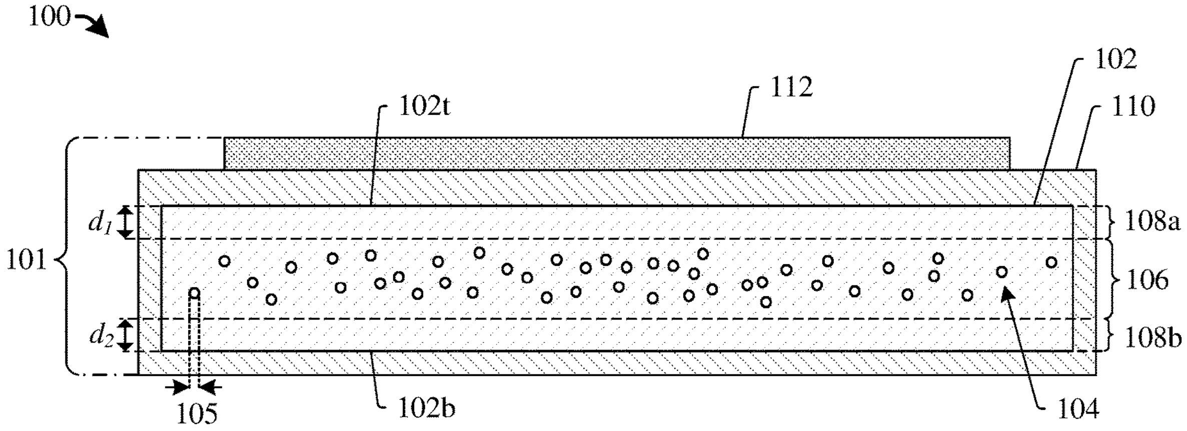
FIG. 1 illustrates a cross-sectional view of some embodiments of a semiconductor structure comprising a semiconductor-on-insulator (SOI) substrate having a central region comprising bulk macro defects (BMDs) vertically surrounded by denuded regions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor-on-insulator (SOI) substrates are used in many integrated chip applications. For example, in recent years SOI substrate have found widespread use in logic devices, bi-polar CMOS-DMOS devices, high voltage devices (e.g., devices operating at 100 V or more), embedded flash devices, or the like. SOI substrates typically comprise a thick layer of semiconductor material (e.g., a handle substrate) separated from an overlying device layer (i.e., active layer) by an insulating layer. Transistor devices are typically fabricated within the device layer. Transistors fabricated within the device layer are able to switch signals faster, run at lower voltages, and are much less vulnerable to signal noise from background cosmic ray particles than devices formed within a bulk substrate.

A handle substrate used to form an SOI substrate may be formed by the Czochralski process. During the Czochralski process, silicon is melted within a quartz crucible at high temperatures. A seed crystal is then dipped into the molten silicon, and slowly pulled outward to extract a large, single-crystal, cylindrical ingot. The ingot is subsequently sliced to form the handle substrate. During formation of the handle substrate, oxygen may be incorporated into the silicon from the quartz crucible. The oxygen can enter into the silicon crystal as precipitates to form bulk micro defects (e.g., slip lines, crystal originated particles (COPs), or the like).

In bulk substrates, bulk micro defects can lead to leakage paths between adjacent transistor devices since the transistor devices are formed within a substrate having the bulk micro defects. In contrast, while a handle substrate of an SOI substrate may contain bulk micro defects (e.g., having a concentration of less than $1\times10^{8}$ bulk micro defects/cm$^{3}$), the negative electrical effects of the bulk micro defects on the transistor devices is mitigated since transistor devices are formed within a device layer that is separated from the handle substrate by an insulating layer. However, it has been appreciated that undesirable wafer distortion (warping) within a handle substrate can stress a device layer and cause slip lines (e.g., defects resulting from the introduction of thermoelastic stresses arising from high temperature exposure) to form within the device layer during high temperature thermal anneals (e.g., during thermal processes over approximately 1000° C.). Furthermore, the undesirable wafer distortion can also lead to overlay errors in photolithography processes performed during subsequent processing.

In some embodiments, the present disclosure relates to a method of forming a semiconductor-on-insulator (SOI) substrate having a handle substrate with a high structural integrity that minimizes undesirable wafer distortion (warpage). In some embodiments, the SOI substrate comprises a handle substrate bonded to a device layer by way of an insulating layer. The handle substrate comprises a semiconductor material and has denuded regions arranged along opposing outermost surfaces and surrounding a central region. The central region has a relatively high concentration of bulk macro defects (BMDs)(e.g., greater than approximately $1\times10^8$ BMDs/$cm^3$), while the denuded regions have a lower concentration of BMDs than the central region. The relatively high concentration and large sizes (e.g., greater than approximately 2 nm) of the BMDs within the central region cause mitigate warpage of the handle wafer, because the BMDs introduce materials (e.g., oxide) into the handle substrate that have a greater stiffness than the semiconductor material. Furthermore, the lower concentration of BMDs within the denuded regions prevent defects from the handle wafer from negatively impacting an overlying layer. The relatively low wafer distortion of the handle substrate minimizes the formation of overlay errors and slip-lines within the device layer.

FIG. 1 illustrates a cross-sectional view of some embodiments of a semiconductor structure 100 comprising a semiconductor-on-insulator (SOI) substrate having a central region comprising bulk macro defects (BMDs) vertically surrounded by denuded regions.

The semiconductor structure 100 comprises a SOI substrate 101 having an insulating layer 110 disposed between a handle substrate 102 and a device layer 112 (i.e., an active layer). In some embodiments, the insulating layer 110 may continuously extend around outermost surfaces of the handle substrate 102. In some embodiments, the handle substrate 102 may comprise a first semiconductor material such as silicon, germanium, or the like. In some embodiments, the insulating layer 110 may comprise an oxide (e.g., silicon dioxide, germanium oxide, or the like), nitride (e.g., silicon oxynitride), or the like. In some embodiments, the device layer 112 may comprise a second semiconductor material such as silicon, germanium, or the like. In some embodiments, the first semiconductor material may be a same material as the second semiconductor material.

The handle substrate 102 comprises a central region 106 vertically disposed between a first denuded region **108*a* and a second denuded region 108*b*. The first denuded region 108*a* is disposed along a top surface 102*t* of the handle substrate 102 and the second denuded region 108*b* is disposed along a bottom surface 102*b* of the handle substrate 102. In some embodiments, the first denuded region 108*a* may extend into the handle substrate 102 to a first depth $d_1$ and the second denuded region 108*b* may extend into the handle substrate 102 to a second depth $d_2$. For example, the first denuded region 108*a* may extend from the top surface 102*t* to the first depth $d_1$ and the second denuded region 108*b* may extend from the bottom surface 102*b*** to the second depth $d_2$.

The first depth $d_1$ may be sufficiently large to prevent defects along a top of the handle substrate 102 that can weaken bonding between the handle substrate 102 and the insulating layer 110. Furthermore, the first depth $d_1$ may be sufficiently small so as to provide the handle substrate 102 with a rigidity that prevents warpage of the handle substrate 102 (e.g., the first depth $d_1$ may provide the central region 106 with a thickness that is sufficient to prevent warpage of the handle substrate 102). For example, in some embodiments, the first depth $d_1$ and the second depth $d_2$ may be in a range of between approximately 0.05 microns (μm) and approximately 50 μm. In other embodiments, the first depth $d_1$ and the second depth $d_2$ may be in a range of between approximately 0.05 μm and approximately 100 μm. In yet other embodiments, the first depth $d_1$ and the second depth $d_2$ may be in ranges of between approximately 0.05 μm and approximately 10 μm, between approximately 0.5 μm and approximately 10 μm, between approximately 5 μm and approximately 20 μm, or between approximately 1 μm and approximately 20 μm. It will be appreciated that other depth values for the first depth $d_1$ and the second depth $d_1$ may also be within the scope of the disclosure.

A plurality of bulk macro defects (BMDs) 104 are disposed within the handle substrate 102. The central region 106 comprises a first concentration of the plurality of BMDs 104, while the first denuded region **108*a* and the second denuded region 108*b* comprise one or more second concentrations of the plurality of BMDs 104. The first concentration is greater than the one or more second concentrations. In some embodiments, the first concentration may be greater than approximately $1\times10^8$ BMDs/$cm^3$. In other embodiments, the first concentration may be greater than approximately $5\times10^8$ BMDs/$cm^3$. In some embodiments, the one or more second concentrations may be approximately equal to zero, so that the top surface 102*t* and the bottom surface 102*b* of the handle substrate 102 are substantially free of BMDs. Having the top surface 102*t* and the bottom surface 102*b* substantially free of BMDs prevents the plurality of BMDs 104 from negatively affecting a bond strength with the insulating layer 110**.

In various embodiments, the plurality of BMDs 104 may comprise slip lines, crystal originated particles (COPs), or the like. Slip lines are defects formed within a substrate by the introduction of thermoelastic stresses arising from high temperature exposure, while COPs are cavities in the substrate. In some embodiments, the plurality of BMDs 104 may have sizes 105 (e.g., lengths or widths) that are greater than approximately 2 nm. In other embodiments, the plurality of BMDs 104 may have sizes 105 that are greater than approximately 5 nm. In yet other embodiments, the plurality of BMDs 104 may have sizes 105 that are between approximately 3 nm and approximately 100 nm, that are between approximately 50 nm and approximately 100 nm, or that are between approximately 75 nm and approximately 100 nm. It will be appreciated that other sizes may also be within the scope of the disclosure.

The relatively large sizes and high concentration of the plurality of BMDs 104 give the handle substrate 102 a good structural integrity that mitigates warping of the handle substrate 102. This is because the plurality of BMDs 104 introduce materials into the handle substrate 102 that have a greater structural integrity (e.g., stiffness) than the first semiconductor material, thereby increasing a structural rigidity of the handle substrate 102. For example, the plurality of BMDs 104 may comprise an oxide that has a greater stiffness than pure silicon, thereby reducing a warpage of the handle substrate 102.

The relatively low warpage of the handle substrate 102 can mitigate the formation of slip lines within the device layer 112. Furthermore, the relatively low warpage of the handle substrate 102 can also and/or alternatively mitigate overlay errors for lithographic processes performed on the device layer 112. In some embodiments, lithographic overlay errors can be reduced by up to approximately 85%. For example, a handle substrate that does not have a high concentration of DMBs within the central region 106 may have a maximum overlay error of approximately 136 nm, while the handle substrate 102 having a concentration of approximately $4.5\times10^9$ BMD/cm$^3$ within the central region 106 will have a maximum overlay error of approximately 22 nm.

Figure 2:
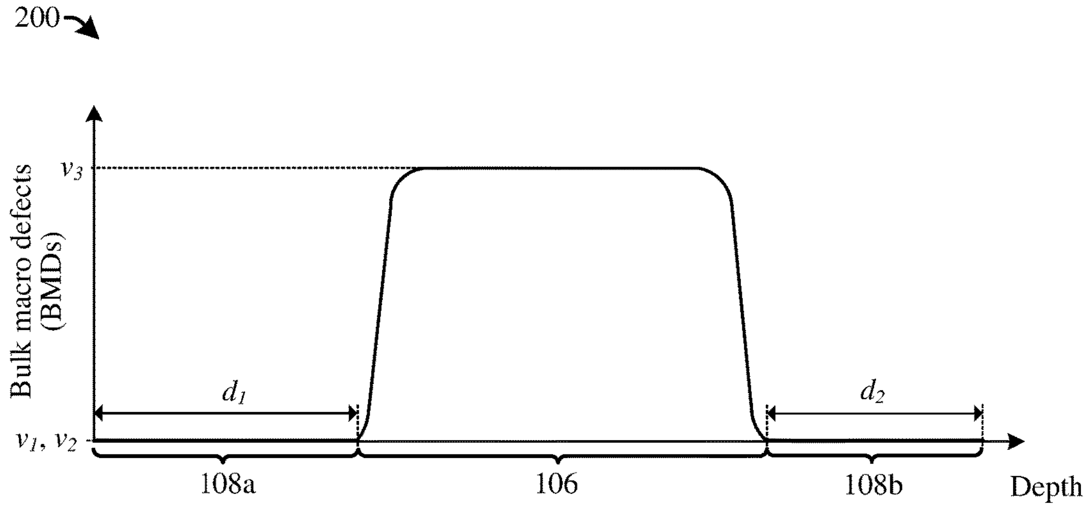
FIG. 2 illustrates a graph of some embodiments of BMD concentrations as a function of position within a handle substrate of an SOI substrate.

FIG. 2 illustrates a graph 200 showing some embodiments of a BMD concentration as a function of position within a handle substrate of an SOI substrate.

As shown in graph 200, within a first denuded region 108*a* the concentration of bulk macro defects (BMDs) has a first value $v_1$, within a second denuded region 108*b* the concentration of BMDs has a second value $v_2$, and within a central region 106 the concentration of BMDs has a third value $v_3$ that is larger than the first value $v_1$ and the second value $v_2$. In some embodiments, the first value $v_1$ and the second value $v_2$ are approximately equal to zero. In some embodiments, the third value $v_3$ may be in a range of between approximately $1\times10^8$ BMDs/cm$^3$ and approximately $1\times10^{10}$ BMDs/cm$^3$. In other embodiments, the third value $v_3$ may be in a range of between approximately $8\times10^8$ BMDs/cm$^3$ and approximately $9\times10^9$ BMDs/cm$^3$. In yet other embodiments, the third value $v_3$ may have larger or smaller values. Having the third value $v_3$ in a range of between approximately $1\times10^8$ BMDs/cm$^3$ and approximately $1\times10^{10}$ BMDs/cm$^3$ allows for DMBs within a central region of a handle substrate (e.g., handle substrate 102) to reduce a warpage of the handle substrate.

Figure 3A:
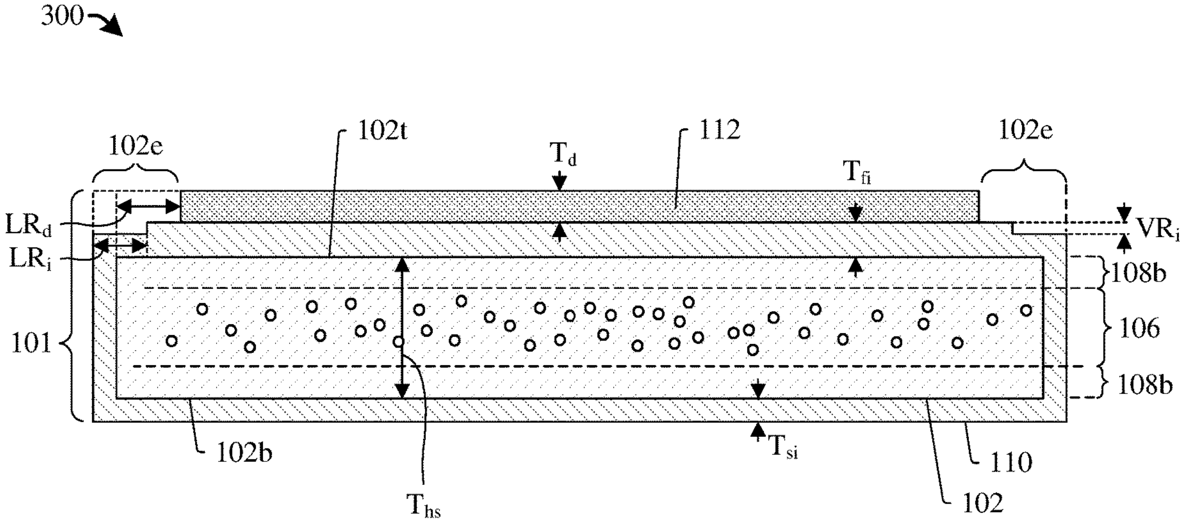
FIGS. 3A-3B illustrate some additional embodiments of a semiconductor structure comprising an SOI substrate having a central region comprising BMDs vertically surrounded by denuded regions.
Figure 3B:
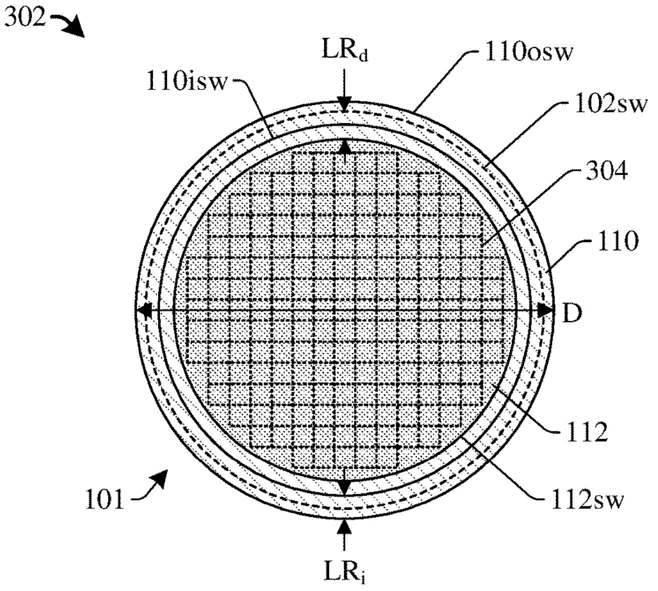

FIGS. 3A-3B illustrates some additional embodiments of a semiconductor structure comprising a semiconductor-on-insulator (SOI) substrate having a central region comprising bulk macro defects (BMDs) vertically surrounded by denuded regions.

FIG. 3A illustrates a cross-sectional view 300 of some additional embodiments of a semiconductor structure. As shown in cross-sectional view 300, the semiconductor structure comprises an SOI substrate 101 including a handle substrate 102, an insulating layer 110, and a device layer 112. The handle substrate 102 may be or comprise a semiconductor material, such as silicon, germanium, or the like. In some embodiments, the handle substrate 102 is doped with p-type or n-type dopants. In some embodiments, the handle substrate 102 has a thickness $Th_{hs}$ in a range of between approximately 700 microns (μm) and approximately 800 μm, between approximately 750 μm and approximately 800 μm, or other suitable values. In some embodiments, the handle substrate 102 may have a resistance that is in a range of between approximately 8 ohm-cm and approximately 12 ohm-cm, between approximately 10 ohm-cm and approximately 12 ohm-cm, or other suitable values. In some embodiments, the handle substrate 102 may have an oxygen concentration that is in a range of between approximately 9 parts per million atoms (ppma) and approximately 30 ppma. In other embodiments, the handle substrate 102 may have an oxygen concentration that is in a range of between approximately 9 ppma and approximately 15 ppma. In yet other embodiments, the handle substrate 102 may have an oxygen concentration that is greater than 30 ppma or less than 9 ppma. The low oxygen concentration and the high resistance individually reduce substrate and/or radio frequency (RF) losses.

The insulating layer 110 overlies the handle substrate 102 and may comprise and oxide (e.g., silicon oxide, silicon-rich oxide (SRO), or the like), a nitride (e.g., silicon oxynitride), or the like. In some embodiments, the insulating layer 110 completely covers a top surface 102*t* of the handle substrate 102. In at least some embodiments in which the handle substrate 102 has the high resistance, completely covering the top surface 102*t* of the handle substrate 102 prevents arcing during plasma processing (e.g., plasma etching) used to form devices (not shown) on the device layer 112. In some embodiments, the insulating layer 110 completely encloses the handle substrate 102.

The insulating layer 110 has a first insulator thickness $T_{fi}$ between the handle substrate 102 and the device layer 112. The first insulator thickness $T_{fi}$ is large enough to provide a high degree of electrical insulation between the handle substrate 102 and the device layer 112. In some embodiments, the first insulator thickness $T_{fi}$ is in a range of between approximately 0.2 μm and approximately 2.5 μm, between approximately 1 μm and approximately 2 μm, or other suitable values. In some embodiments, the insulating layer 110 has a second insulator thickness $T_{si}$, along a bottom surface 102*b* of the handle substrate 102 and/or along sidewalls of the handle substrate 102. In some embodiments, the second insulator thickness $T_{si}$, is less than the first insulator thickness $T_{fi}$. In some embodiments, the second insulator thickness $T_{si}$, is about 20-6000 angstroms, about 20-3010 angstroms, about 3010-6000 angstroms, or other suitable values.

In some embodiments, the insulating layer 110 has stepped profiles at SOI edge portions 102*e* of the SOI substrate 101 that are respectively on opposite sides of the SOI substrate 101. In some embodiments, the insulating layer 110 has upper surfaces that are at the SOI edge portions 102*e* and that are recessed below a top surface of the insulating layer 110 by a vertical recess amount $VR_i$. The vertical recess amount $VR_i$ may, for example, be about 20-6000 angstroms, about 20-3010 angstroms, about 3010-6000 angstroms, or other suitable values. In some embodiments, the insulating layer 110 has inner sidewalls that are laterally recessed outermost sidewalls of the insulating layer 110 by an insulator lateral recess amount $LR_i$. The insulator lateral recess amount $LR_i$ may, for example, be about 0.8-1.2 millimeters, about 0.8-1.0 millimeters, about 1.0-1.2 millimeters, or other suitable values.

The device layer 112 overlies the insulating layer 110 and may comprise a semiconductor material such as silicon, germanium, or the like. The device layer 112 has a thickness $T_d$. In various embodiments, the thickness $T_d$ may be in a range of between approximately 0.2 microns and approximately 10.0 microns, between approximately 1 micron and approximately 5 microns, or other suitable values. In some embodiments, the device layer 112 has outermost sidewalls that are laterally recessed respectively from outermost sidewalls of the handle substrate 102 by a device lateral recess amount $LR_d$. The device lateral recess amount $LR_d$ may, for example, be about 1.4-2.5 millimeters, about 1.4-1.9 millimeters, about 1.9-2.5 millimeters, or other suitable values. Because the outermost sidewalls of the device layer 112 are laterally recessed respectively from outermost sidewalls of the handle substrate 102, the central region 106 laterally extends past opposing outermost sidewalls of the device layer 112 by non-zero distances.

FIG. 3B illustrates a top-view 302 of some embodiments of the cross-sectional view 300. As shown in top-view 302, the SOI substrate 101 may have a substantially circular shape. In some embodiments, the SOI substrate 101 comprises a plurality of IC dies 304 arranged in a grid across the device layer 112. In some embodiments, an inner sidewall 110*isw* of the insulating layer 110 is laterally recessed from an outer sidewall 110*osw* of the insulating layer 110 by an insulator lateral recess amount $LR_i$. In some embodiments, a sidewall 112*sw* of the device layer 112 is laterally recessed from a sidewall 102*sw* (shown in phantom) of the handle substrate 102 by a device lateral recess amount $LR_d$.

Figure 4:
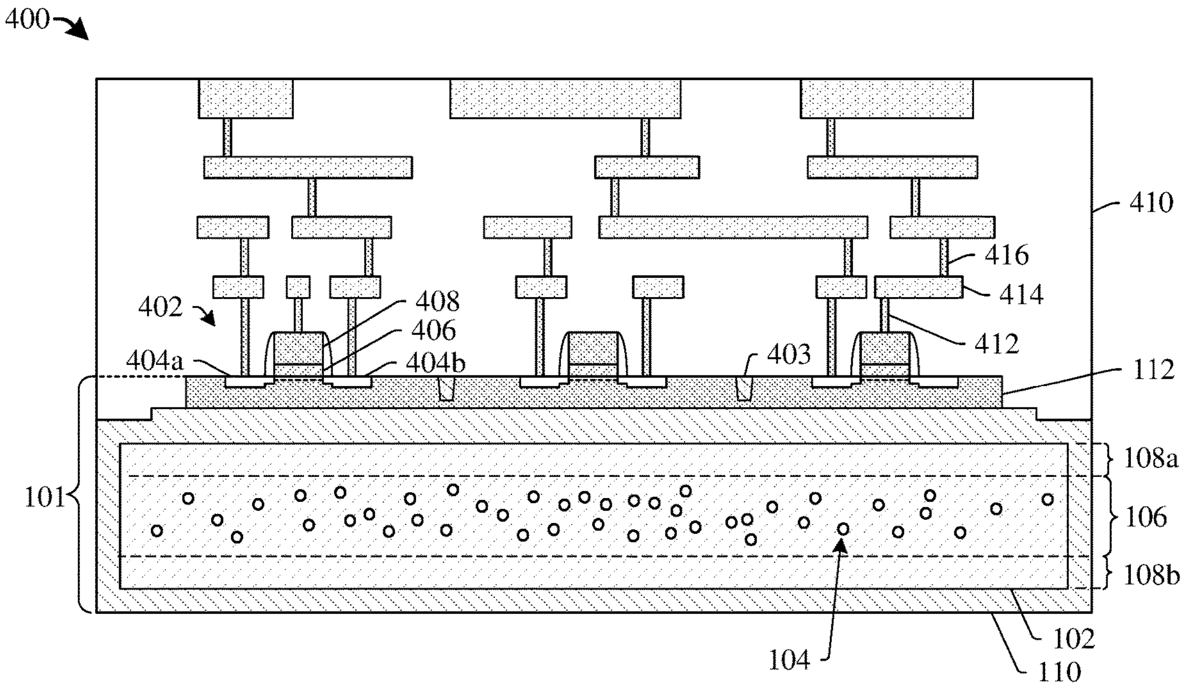
FIG. 4 illustrates a cross-sectional view of some additional embodiments of a semiconductor structure comprising an SOI substrate having a central region comprising BMDs vertically surrounded by denuded regions.

FIG. 4 illustrates a cross-sectional view of some embodiments of a semiconductor structure 400 comprising a SOI substrate having a central region comprising BMDs vertically surrounded by denuded regions.

The semiconductor structure 400 comprises a plurality of transistor devices 402 disposed within a device layer 112 of an SOI substrate 101. In various embodiments, the transistor devices 402 may be, for example, metal-oxide-semiconductor field-effect transistor (MOSFETs), a bi-polar junction transistor (BJT), or the like. In some embodiments, the transistor devices 402 comprise a gate structure disposed between a source region 404*a* and a drain region 404*b*. The gate structure may comprise a gate electrode 408 separated from the device layer 112 by a gate dielectric layer 406. The source region 404*a* and the drain region 404*b* have a first doping type and directly adjoin portions of the device layer 112 having a second doping type opposite the first doping type. In various embodiments, the gate dielectric layer 406 may be or comprise, silicon oxide, silicon nitride, silicon oxynitride, or the like. In various embodiments, the gate electrode 408 may be or comprise, doped polysilicon, a metal, or the like. In some embodiments, the plurality of transistor devices 402 may be electrically isolated from one another by isolation structures 403 disposed within an upper surface of the device layer 112. In some embodiments, the isolation structures 403 may comprise one or more dielectric materials disposed within a trench in the upper surface of the device layer 112.

A dielectric structure 410 is disposed over the SOI substrate 101. The dielectric structure 410 comprises a plurality of inter-level dielectric (ILD) layers stacked onto one another. In various embodiments, the dielectric structure 410 may comprise one or more of borophosphosilicate glass (BPSG), phosphor-silicate glass (PSG), undoped silicon glass (USG), silicon oxide, or the like. The dielectric structure 410 surrounds a plurality of conductive interconnect layers. In various embodiments, the plurality of conductive interconnect layers may comprise conductive contacts 412, interconnect wires 414, and interconnect vias 416. The conductive contacts 412, interconnect wires 414, and interconnect vias 416 may be or comprise, for example, copper, aluminum copper, aluminum, tungsten, or the like.

Figure 5:
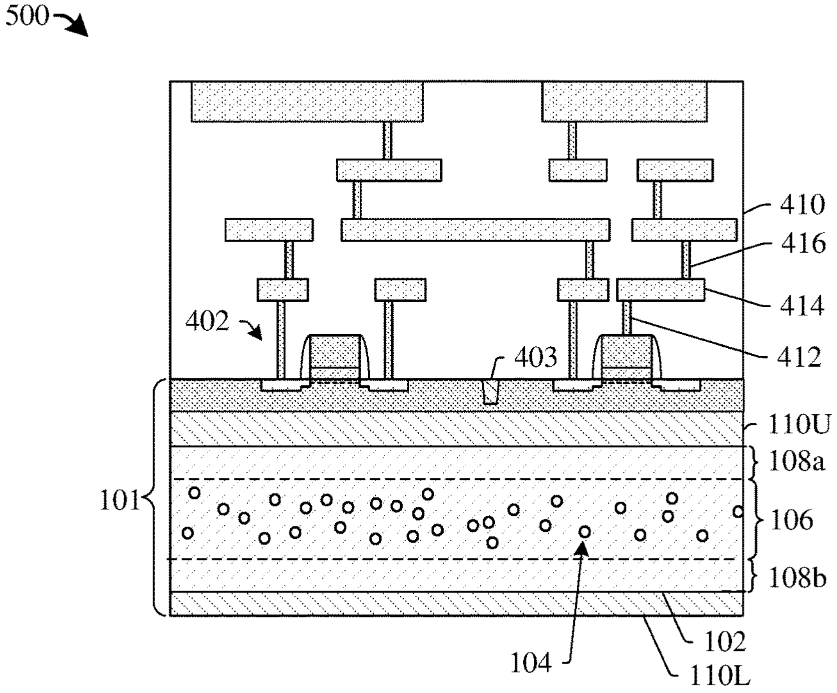
FIG. 5 illustrates a cross-sectional view of some additional embodiments of an integrated chip die comprising an SOI substrate having a central region comprising BMDs vertically surrounded by denuded regions.

FIG. 5 illustrates a cross-sectional view of some embodiments of a semiconductor die 500 comprising a SOI substrate having a central region comprising BMDs vertically surrounded by denuded regions. The semiconductor die 500 is a singulated die, which may be a diced region of the semiconductor structure 400 of FIG. 4, for example.

The semiconductor die 500 comprises a handle substrate 102 coupled to a device layer 112 by way of an upper insulating layer 110U. In some embodiments, a lower insulating layer 110L, which is discontinuous with the upper insulating layer 110U, may be arranged along a lower surface of the device layer 112 that faces away from the upper insulating layer 110U. In some embodiments, the handle substrate 102, the device layer 112, the upper insulating layer 110U, and the lower insulating layer 110L have sidewalls that are aligned along a line extending along a side of the semiconductor die 500. In such embodiments, the handle substrate 102 extends to outermost sidewalls of the upper insulating layer 110U and the lower insulating layer 110L.

The handle substrate 102 comprises a central region 106 vertically surrounded by a first denuded region 108*a* and a second denuded region 108*b*. The central region comprises a plurality of bulk macro defects (BMDs). The plurality of BMDs 104 extend between a first outermost sidewall of the semiconductor die 500 and a second outermost sidewall of the semiconductor die 500.

FIGS. 6A-19 illustrate cross-sectional views 600-1900 of some embodiments of a method of forming a SOI substrate comprising a handle substrate having a central region comprising a plurality of BMDs disposed between denuded regions. Although FIGS. 6A-19 are described in relation to a method, it will be appreciated that the structures disclosed in FIGS. 6A-19 are not limited to such a method, but instead may stand alone as structures independent of the method.

FIGS. 6A-6D illustrate cross-sectional views 600-614 showing some embodiments of a method of forming a handle substrate having a central region comprising a plurality of BMDs disposed between denuded regions.

Figure 6A:
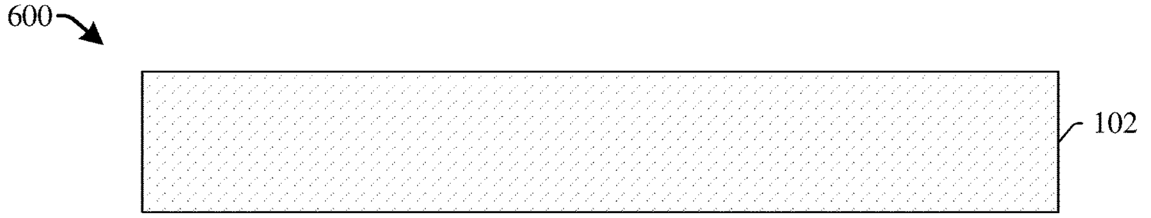
FIGS. 6A-19 illustrate cross-sectional views of some embodiments of a method of forming an SOI substrate comprising a handle substrate having a central region comprising a plurality of BMDs disposed between denuded regions.

As shown in cross-sectional view 600 of FIG. 6A, a handle substrate 102 is provided. In some embodiments, the handle substrate 102 may comprise a semiconductor material, such as silicon, germanium, or the like. In some embodiments, the handle substrate 102 has a resistance that is in a range of between approximately 8 ohms/cm and approximately 12 ohm/cm. In some embodiments, the handle substrate 102 has an oxygen concentration of between approximately 9 ppma (parts per million atoms) and approximately 30 ppma.

Figure 6B:
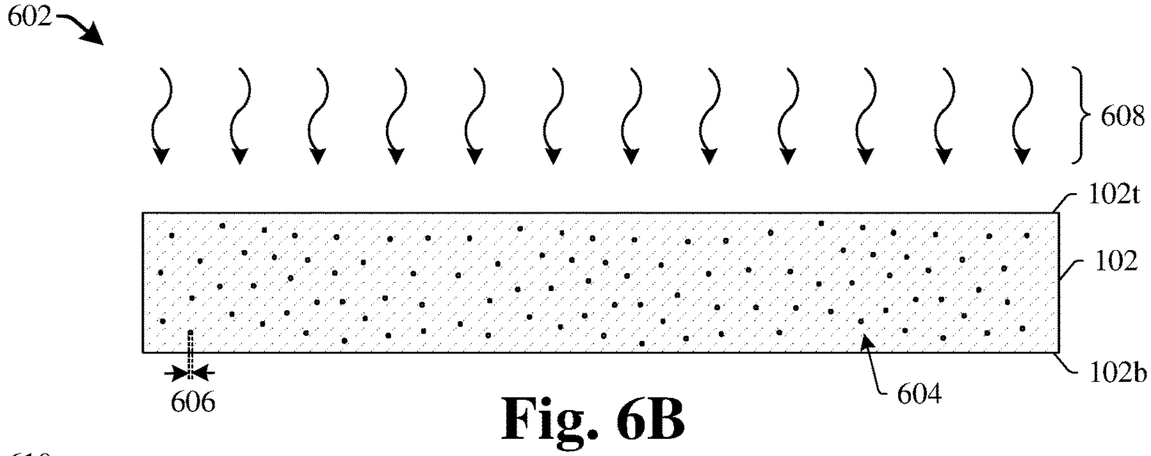

As shown in cross-sectional view 602 of FIG. 6B, a plurality of bulk micro defects 604 are formed within the handle substrate 102. In some embodiments, the plurality of bulk micro defects 604 may have sizes 606. In some embodiments, the sizes 606 are in a range of between approximately 0.2 nanometers (nm) and approximately 5 nm. In some embodiments, the plurality of bulk micro defects 604 may be formed by a first thermal process 608 performed on the handle substrate 102. In some embodiments, the first thermal process 608 may expose the handle substrate 102 to a temperature in a range of between approximately 500 degrees Celsius (° C.) and approximately 800° C. for a time of between approximately 2 hours and approximately 8 hours. In other embodiments, the first thermal process 608 may expose the handle substrate 102 to a temperature range that is below 500° C. or above 800° C. for a time that is below 2 hours or above 8 hours. In some embodiments, the plurality of bulk micro defects 604 are formed to be substantially homogeneous between a top surface 102*t* and a bottom surface 102*b* of the handle substrate 102.

Figure 6C:
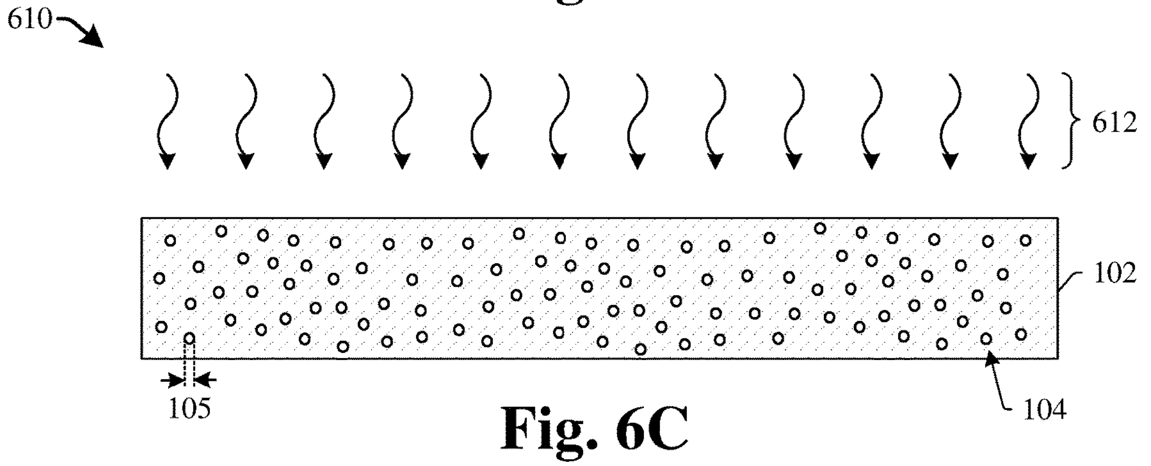

As shown in cross-sectional view 610 of FIG. 6C, sizes of the plurality of bulk micro defects (604 of FIG. 6B) are increased to form a plurality of bulk macro defects (BMDs) 104 within the handle substrate 102. The plurality of BMDs 104 have sizes 105 that are larger than the sizes of the plurality of micro defects (606 of FIG. 6B). In some embodiments, the sizes 105 may be between approximately 1,000% and approximately 20,000% larger than the sizes of the plurality of micro defects (606 of FIG. 6B). In some embodiments, the sizes 105 are in a range of between approximately 3 nanometers (nm) and approximately 100 nm. In some embodiments, the plurality of BMDs may be formed by a second thermal process 612 performed on the handle substrate 102. In some embodiments, the second thermal process 612 may be performed at a higher temperature than the first thermal process. In some embodiments, the second thermal process 612 may expose the handle substrate 102 to a temperature in a range of between approximately 1050° C. and approximately 1150° C. for a time of between approximately 2 hours and approximately 4 hours. In other embodiments, the second thermal process 612 may expose the handle substrate 102 to a temperature range that is below 1050° C. or above 1150° C. for a time that is below 2 hours or above 4 hours.

Figure 6D:
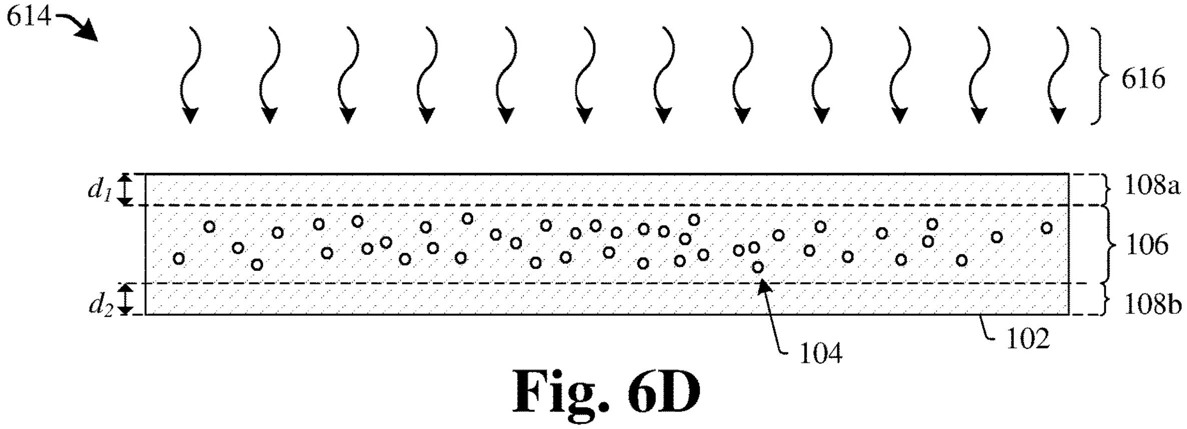

As shown in cross-sectional view 614 of FIG. 6D, some of the plurality of BMDs 104 are removed from within denuded regions 108*a*-108*b* disposed along top and bottom surfaces of the handle substrate 102. The removal of some of the plurality of BMDs 104 from within the denuded regions 108*a*-108*b* results in the formation of a central region 106 of the handle substrate 102 that has a higher concentration of BMDs 104 than the denuded regions 108*a*-108*b*. In some embodiments, the central region 106 has a concentration of BMDs 104 that is between approximately $1\times10^{8}$ BMDs/cm$^3$ and approximately $1\times10^{10}$ BMDs/cm$^3$. In other embodiments, the central region 106 has a concentration of BMDs 104 that is between approximately $8\times10^{8}$ BMDs/cm$^3$ and approximately $9\times10^{9}$ BMDs/cm$^3$. In some embodiments, the denuded regions 108*a*-108*b* may extend to depths, $d_1$ and $d_2$, within the handle substrate 102 that are between approximately 50 nm and approximately 50 μm.

In some embodiments, some of the plurality of BMDs 104 are removed from within denuded regions 108*a*-108*b* by a third thermal process 616. In some embodiments, the third thermal process 616 may be performed by exposing the handle substrate 102 to a high temperature environment comprising an argon gas and/or a hydrogen gas. In some embodiments, the handle substrate 102 may be exposed to the argon and/or hydrogen gas at a temperature in a range of between approximately 1100° C. and approximately 1200° C. for a time of between approximately 1 hour and approximately 16 hours. In other embodiments, the handle substrate 102 may be exposed to argon and/or hydrogen gas at a temperature of greater than 1100° C. or less than 1200° C. for a time of between less than 1 hour or greater than 16 hours.

Figure 7A:
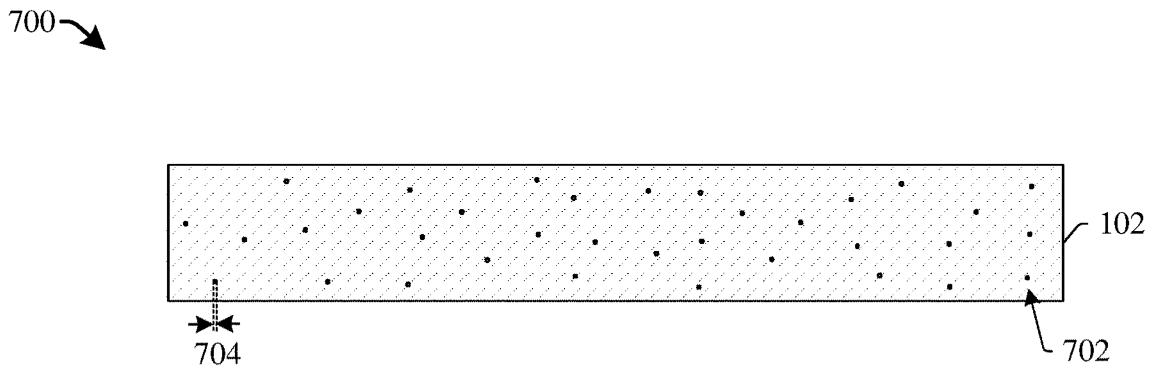
Figure 7B:
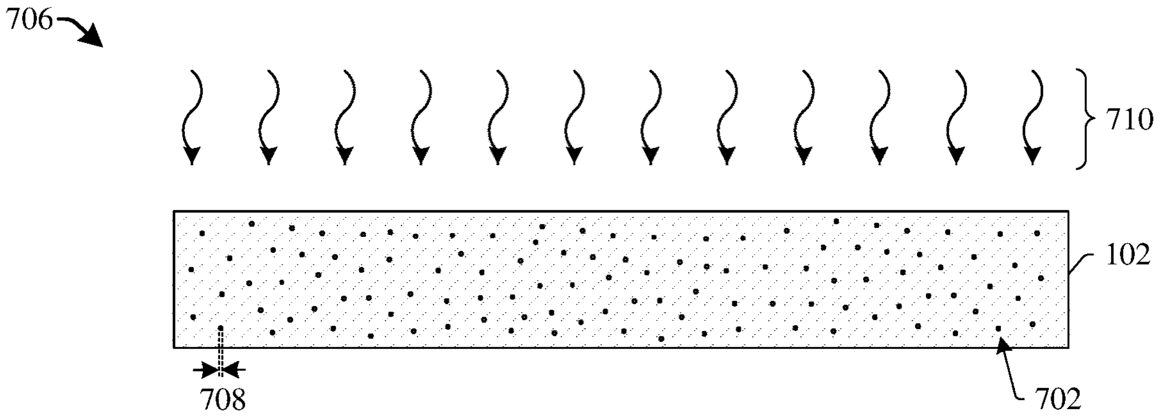
Figure 7C:
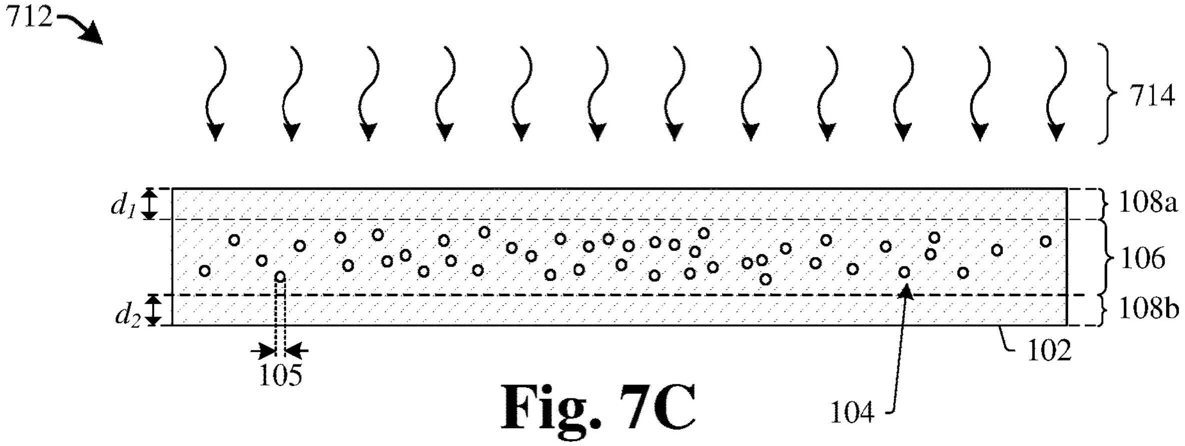

FIGS. 7A-7C illustrate cross-sectional views 700-712 of some alternative embodiments of the formation of a handle substrate having a central region comprising a plurality of BMDs disposed between denuded regions.

As shown in cross-sectional view 700 of FIG. 7A, a handle substrate 102 comprising a plurality of bulk micro defects 702 is provided. In some embodiments, the handle substrate 102 may comprise nitrogen doped silicon (e.g., a p-type nitrogen doped silicon substrate). In some embodiments, the handle substrate 102 has an oxygen concentration of between approximately 9 ppma and approximately 15 ppma. In other embodiments, the handle substrate 102 has an oxygen concentration of less than 9 ppma (e.g., of approximately 0 ppma), greater than approximately 15 ppma, or other suitable values. In some embodiments, the plurality of bulk micro defects 702 may have sizes 704 that are in a range of between approximately 0.2 nm and approximately 3 nm.

As shown in cross-sectional view 706 of FIG. 7B, a number and/or density of the plurality of bulk micro defects 702 within the handle substrate 102 is increased from a first non-zero number to a second non-zero number. In some embodiments, the number and/or density of the plurality of bulk micro defects 702 within the handle substrate 102 is increased by performing a first thermal process 710 on the handle substrate 102. In some embodiments, the first thermal process 710 may expose the handle substrate 102 to a temperature in a range of between approximately 500° C. and approximately 800° C. for a time of between approximately 2 hours and approximately 8 hours. In other embodiments, the first thermal process 710 may expose the handle substrate 102 to a temperature range that is below 500° C. or above 800° C. for a time that is below 2 hours or above 8 hours. In some embodiments, the first thermal process may increase sizes of the plurality of bulk micro defects 702. For example, in some embodiments, the plurality of bulk micro defects may have sizes 708 that are in a range of between approximately 0.2 nm and approximately 5 nm.

As shown in cross-sectional view 712 of FIG. 7C, a second thermal process 714 is performed on the handle substrate 102 to remove some of the plurality of BMDs 104 from within denuded regions 108*a*-108*b* disposed along top and bottom surfaces of the handle substrate 102. The removal of some of the plurality of BMDs 104 from within the denuded regions 108*a*-108*b* results in the formation of a central region 106 of the handle substrate 102 that has a higher concentration of BMDs 104 than the denuded regions 108*a*-108*b*. In some embodiments, the denuded regions 108*a*-108*b* may extend to depths, $d_1$ and $d_2$, within the handle substrate 102 that are between approximately 50 nm and approximately 50 μm.

The second thermal process 714 also increases sizes of the second plurality of bulk micro defects (702 of FIG. 7B) to form a plurality of bulk macro defects (BMDs) 104 having sizes 105. In some embodiments, the sizes 105 are in a range of between approximately 2 nanometers (nm) and approximately 100 nm. In some embodiments, the second thermal process 714 exposes the handle substrate 102 to an argon gas and/or a hydrogen gas at a temperature in a range of between approximately 1100° C. and approximately 1200° C. for a time of between approximately 1 hour and approximately 16 hours. In other embodiments, the second thermal process 714 may expose the handle substrate 102 to a temperature range that is below 1100° C. or above 1200° C. for a time that is below 1 hour or above 16 hours.

Figure 8:
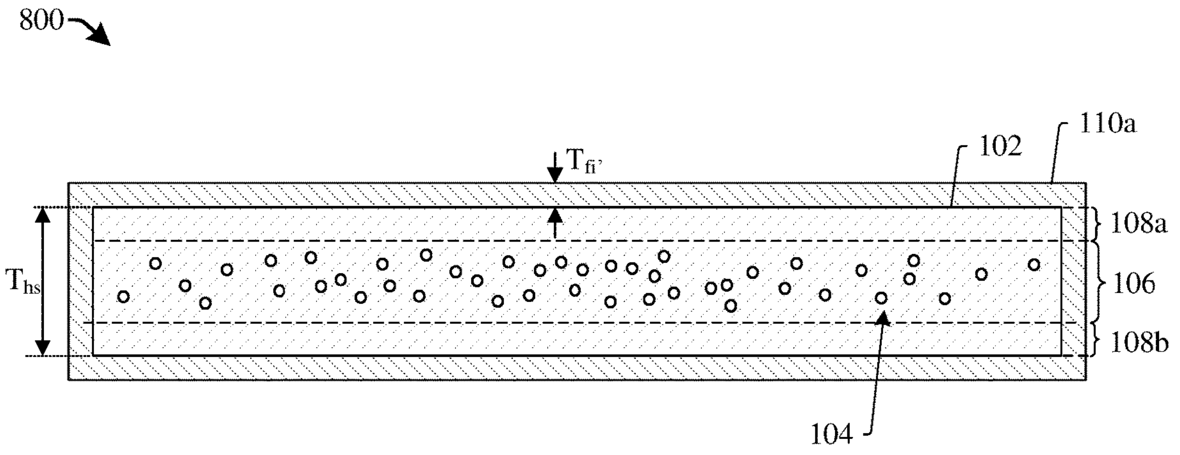

As illustrated by the cross-sectional view 800 of FIG. 8, a first insulating layer 110*a* is formed along one or more surfaces of the handle substrate 102. In some embodiments, the first insulating layer 110*a* is formed to completely cover a top surface 102*t* of the handle substrate 102. In some additional embodiments, the first insulating layer 110*a* is formed to completely enclose the handle substrate 102. In such embodiments, the first insulating layer 110*a* is formed to continuously extend around outer edge of the handle substrate 102. In some embodiments, the first insulating layer 110*a* is or comprises silicon oxide, silicon oxynitride, or the like. In some embodiments, the first insulating layer 110*a* is formed to a thickness $T_{fi'}$ of about 0.2-2.0 μm, about 0.2-1.1 μm, about 1.1-2.0 μm, or other suitable values.

In some embodiments, the first insulating layer 110*a* may be formed by a thermal oxidation process. For example, the first insulating layer 110*a* may be formed by a dry oxidation process using oxygen gas (e.g., $O_2$) or some other gas as an oxidant. As another example, the first insulating layer 110*a* may be formed by a wet oxidation process using water vapor as an oxidant. In some embodiments, the first insulating layer 110*a* is formed at temperatures of about 800-1100° C., about 800-950° C., about 950-1100° C., or other suitable values. In other embodiments, the first insulating layer 110*a* may be formed by a chemical vapor deposition (CVD), a physical vapor deposition (PVD), or the like.

In some embodiments, prior to forming the first insulating layer 110*a*, a first wet cleaning process may be performed on the handle substrate 102. In some embodiments, the first wet cleaning process may be performed by exposing the handle substrate 102 to first wet cleaning solution comprising 1% hydrofluoric acid for between approximately 30 seconds and approximately 120 seconds, followed by a second wet cleaning solution comprising ozone and deionized water for between approximately 15 seconds and approximately 120 seconds, followed by a third wet cleaning solution comprising deionized water, ammonia water, and aqueous hydrogen peroxide for between approximately 15 seconds and approximately 120 seconds.

Figure 9:
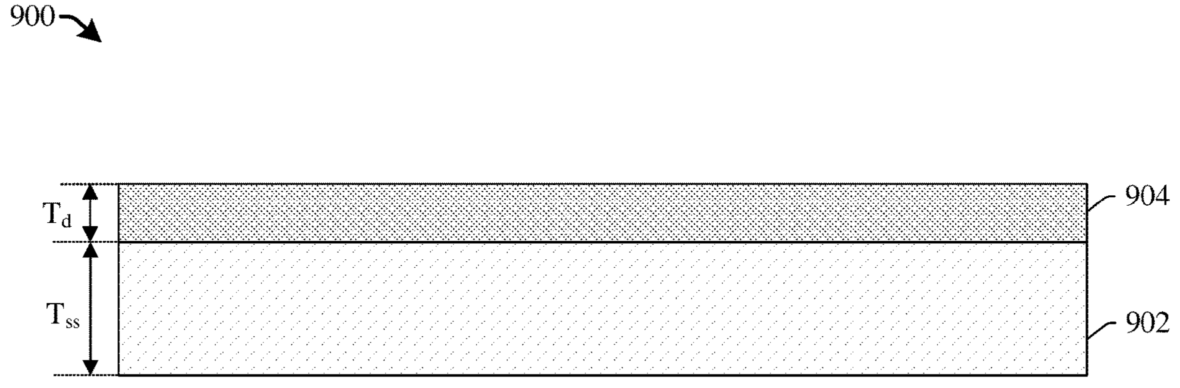

As illustrated by the cross-sectional view 900 of FIG. 9, a sacrificial substrate 902 is provided. In some embodiments, the sacrificial substrate 902 comprises a semiconductor material such as silicon, germanium, or the like. In some embodiments, the sacrificial substrate 902 is doped with p-type or n-type dopants. In some embodiments, the sacrificial substrate 902 may have a resistance that is less than approximately 0.02 Ω/cm. In some embodiments, the resistance may be between approximately 0.01 Ω/cm and approximately 0.02 Ω/cm. In other embodiments, the resistance may be less than approximately 0.01 Ω/cm. In some embodiments, the sacrificial substrate 902 has a lower resistance than the handle substrate. In some embodiments, a thickness $T_{ss}$ of the sacrificial substrate 902 is between approximately 700 μm and approximately 800 μm, between approximately 750 μm and approximately 800 μm, or other suitable thicknesses.

A device layer 904 is formed on the sacrificial substrate 902. The device layer 904 has a thickness $T_d$. In some embodiments, the thickness $T_d$ may be between approximately 2 μm and approximately 9 μm. In some embodiments, the thickness $T_d$ may be less than or equal to approximately 5 μm. In some embodiments, the device layer 904 is or comprises a semiconductor material, such as silicon, germanium or the like. In some embodiments, the device layer 904 is or comprises the same semiconductor material as the sacrificial substrate 902, has the same doping type as the sacrificial substrate 902, and/or has a lower doping concentration than the sacrificial substrate 902. For example, the sacrificial substrate 902 may be or comprise P+monocrystalline silicon, whereas the device layer 904 may be or comprise P−monocrystalline silicon. In some embodiments, the device layer 904 has a low resistance. The low resistance may, for example, be greater than that of the sacrificial substrate 902. Further, the low resistance may, for example, be less than about 8, 10, or 12 Ω/cm, and/or may, for example, be about 8-12 Ω/cm, about 8-10 Ω/cm, about 10-12 Ω/cm, or other suitable values. In some embodiments, a process for forming the device layer 904 comprises molecular beam epitaxy (MBE), vapor phase epitaxy (VPE), liquid phase epitaxy (LPE), some other epitaxial process, or any combination of the foregoing.

In some embodiments, after forming the device layer 904 onto the sacrificial substrate 902, the device layer 904 and sacrificial substrate 902 are cleaned according to a second wet cleaning process. In some embodiments, the second wet cleaning process may be performed by exposing the device layer 904 and sacrificial substrate 902 to first wet cleaning solution comprising 1% hydrofluoric acid for between approximately 30 seconds and approximately 120 seconds, followed by a second wet cleaning solution comprising ozone and deionized water for between approximately 15 seconds and approximately 120 seconds, followed by a third wet cleaning solution comprising deionized water, ammonia water, and aqueous hydrogen peroxide for between approximately 15 seconds and approximately 120 seconds.

Figure 10:
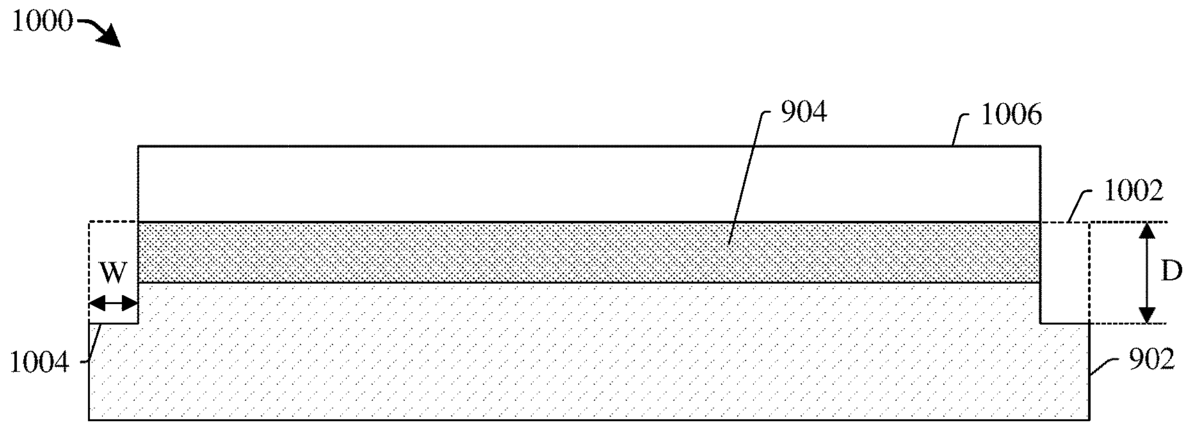

As illustrated by the cross-sectional view 1000 of FIG. 10, the device layer 904 and the sacrificial substrate 902 are patterned to remove parts of the device layer 904 and the sacrificial substrate 902 within edge regions 1002. By removing parts of the device layer 904 and the sacrificial substrate 902 within edge regions 1002, defects (e.g., cracks, chips, etc.) are prevented from forming within the device layer 904 and the sacrificial substrate 902 during subsequent grinding and/or chemical wet etching. The patterning forms a ledge 1004 at an edge of the sacrificial substrate 902. The ledge 1004 is defined by the sacrificial substrate 902. In some embodiments (not shown), the ledge 1004 extends in a closed loop around an outer perimeter of the sacrificial substrate 902. In some embodiments, the ledge 1004 has a width W of about 0.8-1.4 millimeters, about 0.8-1.0 millimeters, about 1.0-1.2 millimeters, or other suitable values. In some embodiments, the ledge 1004 is recessed below an upper or top surface of the device layer 904 by a distance D of about 30-120 μm, about 30-75 μm, about 70-120 μm, or other suitable values.

In some embodiments, the patterning is performed by etching the device layer 904 and the sacrificial substrate 902 according to a mask 1006 formed over the device layer 904. In some embodiments, the mask 1006 is or comprises silicon nitride, silicon oxide, photoresist, and/or the like. In some embodiments, the mask 1006 comprises silicon oxide formed by a deposition process (e.g., PVD, PECVD, MOCVD, or the like). In some such embodiments, the silicon oxide may be formed by a PECVD process at a temperature of between approximately 200° C. and approximately 400° C. In other embodiments, the silicon oxide may be formed by a PECVD process at a temperature of between approximately 350° C. and approximately 400° C., between approximately 250° C. and approximately 350° C., or other suitable values. In some embodiments, the silicon oxide may be formed to a thickness of between approximately 500 angstroms and approximately 3,000 angstroms. In some additional embodiments, the silicon oxide may be formed to a thickness of between approximately 500 angstroms and approximately 10,000 angstroms, between approximately 1,000 angstroms and approximately 2,000 angstroms, or other suitable values.

After the patterning process is completed, the mask 1006 is removed and the device layer 904 and the sacrificial substrate 902 are cleaned to remove etch residue and/or other undesired byproducts produced while performing the patterning. In some embodiments, the mask 1006 may be removed by exposing the mask 1006 to a 1% hydrofluoric acid for a time that is in a range of between approximately 180 seconds and approximately 600 seconds. In some embodiments, the sacrificial substrate 902 may be cleaned by way of a third wet cleaning process performed by exposing the device layer 904 and sacrificial substrate 902 to first wet cleaning solution comprising 1% hydrofluoric acid for between approximately 30 seconds and approximately 120 seconds, followed by a second wet cleaning solution comprising deionized water, ammonia water, and aqueous hydrogen peroxide for between approximately 15 seconds and approximately 120 seconds, followed by a third wet cleaning solution comprising deionized water, hydrochloric acid, and aqueous hydrogen peroxide for between approximately 15 seconds and approximately 120 seconds.

Figure 11:
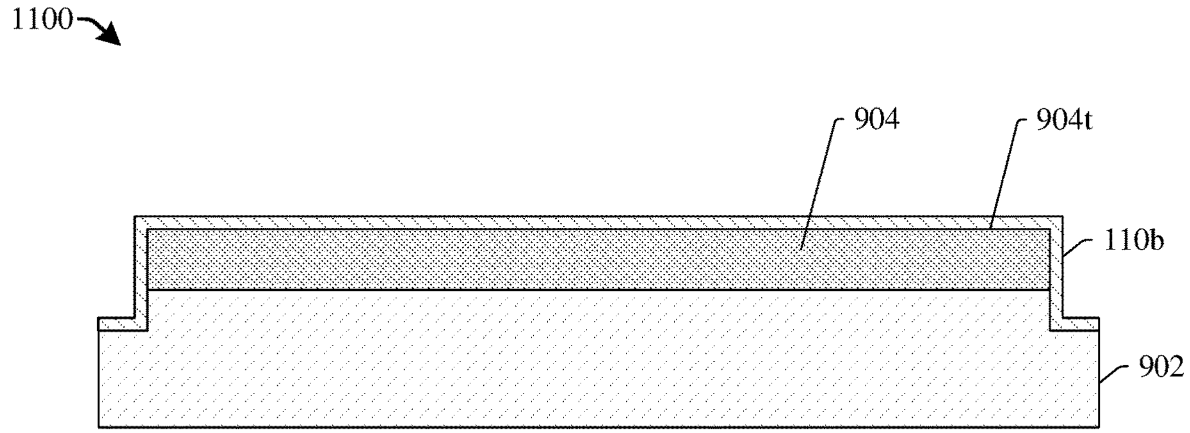

As illustrated by the cross-sectional view 1100 of FIG. 11, a second insulating layer **110*b* is formed on a top surface 904*t* of the device layer 904. In some embodiments, the second insulating layer 110*b* completely covers the top surface 904*t* of the device layer 904. In some embodiments, the second insulating layer 110*b* is or comprises silicon oxide and/or some other dielectric. In some embodiments, the second insulating layer 110***b* is the same dielectric material as the first insulating layer 110*a*. In some embodiments, a thickness $T_{si'}$ of the second insulating layer 110*b* is in a range of between approximately 0 angstroms and approximately 6000 angstroms. In some embodiments, the second insulating layer 110*b* may be formed by a deposition process (e.g., CVD, PVD, or the like). In other embodiments, the second insulating layer 110*b* may be formed by a microwave plasma oxidation process. For example, the second insulating layer 110*b* may be formed by a microwave plasma process. In some embodiments, the plasma process may be performed at a temperature of between approximately 300° C. and approximately 400° C. In some embodiments, the plasma process may use a source gas of hydrogen, helium, oxygen, or the like.

In some embodiments (not shown), the second insulating layer 110*b* may be formed to completely enclose the sacrificial substrate 902 and the device layer 904. In such embodiments, the second insulating layer 110*b* may be formed by a thermal oxidation process. For example, the second insulator layer 110*b* may be formed by a dry oxidation process using oxygen gas (e.g., $O_2$), hydrogen gas, helium gas, or the like. As another example, the second insulator layer 110*b* may be formed by a wet oxidation process using water vapor as an oxidant. In some embodiments, the second insulator layer 110*b* is formed at temperatures of about 750-1100° C., about 750-925° C., about 925-1100° C., or other suitable values.

Figure 12:
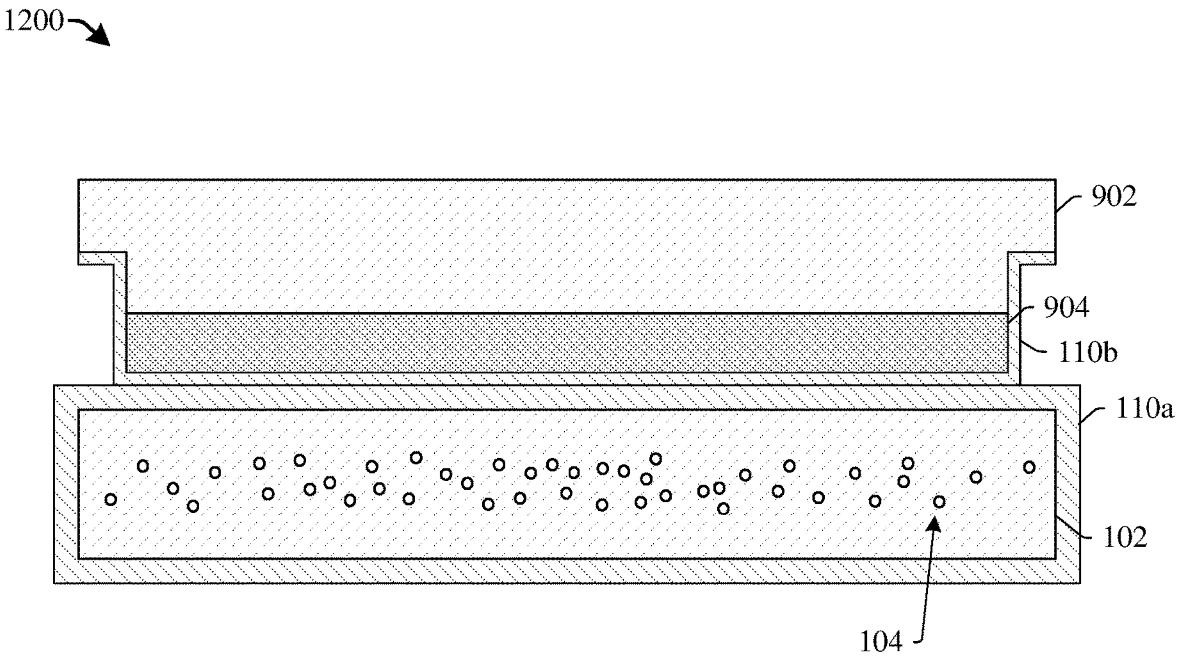

As illustrated by the cross-sectional view 1200 of FIG. 12, the sacrificial substrate 902 is bonded to the handle substrate 102, such that the device layer 904 is between the handle substrate 102 and the sacrificial substrate 902. The bonding process brings the first insulating layer 110*a* into contact with the second insulating layer 110*b*. The first insulating layer 110*a* is then brought into contact with the second insulating layer 110*b* in a processing chamber held at a low pressure (e.g., a pressure of between approximately 0.0001 mBar and 150 mBar). In some embodiments, the bonding process may be performed by exposing the first insulating layer 110*a* and the second insulating layer 110*b* to nitrogen based plasma. In some embodiments, the nitrogen based plasma may be formed from nitrogen gas at a power of between approximately 50 watts (W) and approximately 200 W. In some embodiments, the first insulating layer 110*a* and the second insulating layer 110*b* may be exposed to the nitrogen based plasma for between approximately 10 seconds and approximately 120 second. In some embodiments, a fourth wet cleaning process is performed after exposure to the nitrogen plasma. The fourth wet cleaning process may use a wet cleaning solution comprising deionized water, ammonia water, and aqueous hydrogen peroxide for between approximately 15 seconds and approximately 120 seconds.

In some embodiments, a high temperature nitrogen anneal may be performed after the fourth wet cleaning process. The high temperature nitrogen anneal increases a strength of bonds between the first insulating layer 110*a* and the second insulating layer 110*b*. The high temperature nitrogen anneal may be performed by introducing a nitrogen gas into a processing chamber holding the sacrificial substrate 902 and the handle substrate 102. In some embodiments, the high temperature nitrogen anneal may be performed at a temperature in a range of between approximately 250° C. and approximately 450° C., between approximately 200° C. and approximately 500° C., or other suitable values. In some embodiments, the high temperature nitrogen anneal may be performed at atmospheric pressure for between approximately 30 minutes and approximately 240 minutes, between approximately 50 minutes and approximately 200 minutes, or other suitable values.

Figure 13:
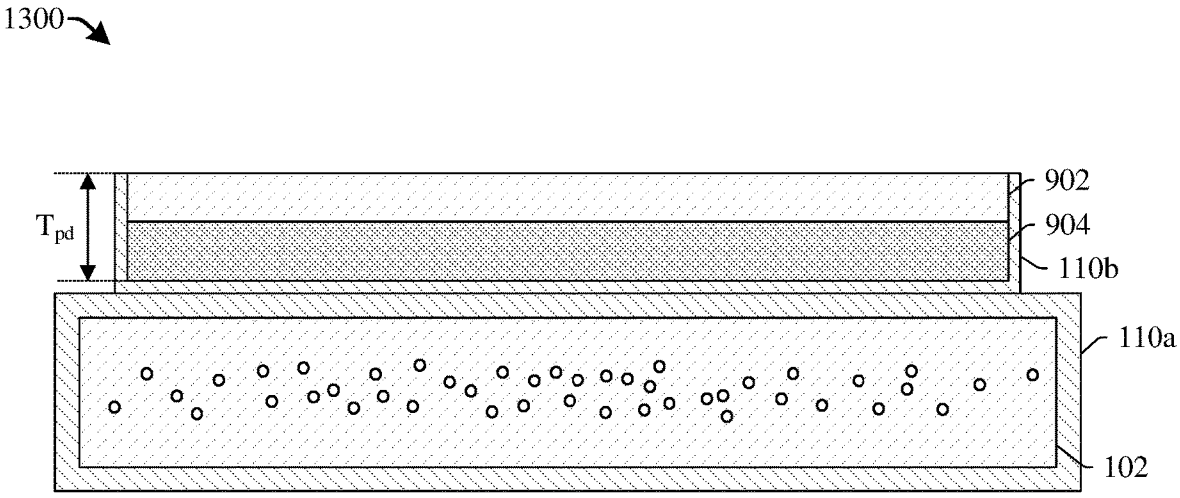

As illustrated by the cross-sectional view 1300 of FIG. 13, a first thinning process is performed. The first thinning process removes an upper portion of the second insulating layer 110*b*, and further removes an upper portion of the sacrificial substrate 902. In some embodiments, the first thinning process is performed into the second insulating layer 110*b* and the sacrificial substrate 902 until the device layer 904 and the sacrificial substrate 902 collectively have a predetermined thickness $T_{pd}$. The predetermined thickness $T_{pd}$ may, for example, about 14-50 μm, about 20-32.5 μm, about 32.5-45 μm, or other suitable values.

In some embodiments, the first thinning process is partially or wholly performed by a mechanical grinding process. In some embodiments, the first thinning process is performed partially or wholly performed by a chemical mechanical polish (CMP). In some embodiments, the first thinning process is performed by a mechanical grinding process followed by a CMP. As noted above, removal of the edge region (1002 of FIG. 10) prevents edge defects from forming at the edge region during the grinding.

Figure 14:
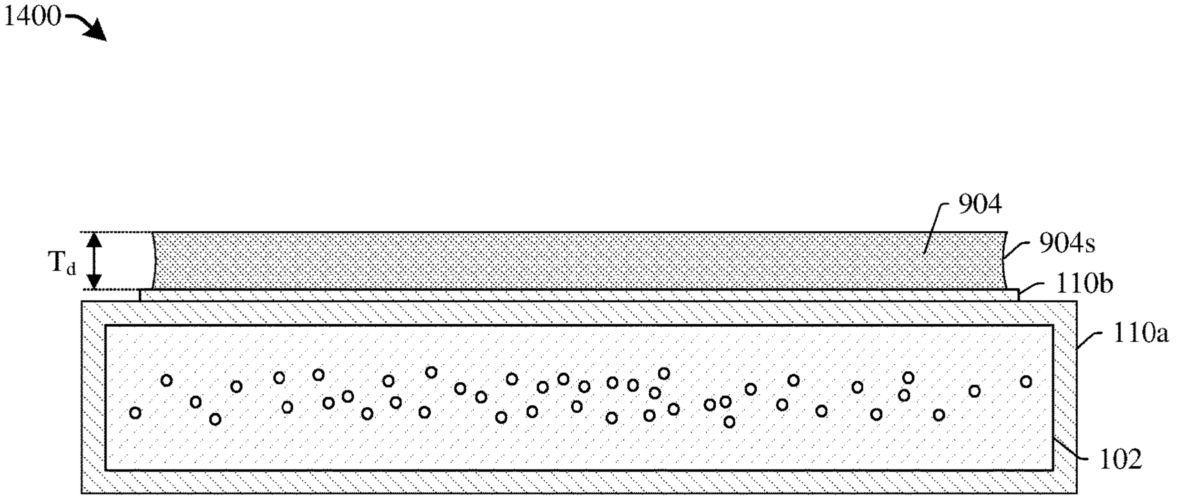

As illustrated by the cross-sectional view 1400 of FIG. 14, an etch is performed to remove the sacrificial substrate (902 of FIG. 14). In some embodiments, the etch further removes a portion of the second insulating layer 110*b* on sidewalls of the device layer 904. Further, in some embodiments, the etch laterally etches sidewalls 904*s* of the device layer 904. Due to the lateral etching, the sidewalls 904*s* of the device layer 904 may, for example, be curved and/or concave. Upon completion of the etch, the thickness Td of the device layer 904 may, for example, be about 0.6-9.5 μm, about 1.8-7.8 μm, about 5.05-9.5 μm, or other suitable values.

In some embodiments, the etch is performed by a hydrofluoric/nitric/acetic (HNA) etch, some other wet etch, a dry etch, or some other etch. The HNA etch may, for example, etch the sacrificial substrate 902 with a chemical solution comprising hydrofluoric acid, nitric acid, and acetic acid. In some embodiments, the etch may have a greater etch rate for the sacrificial substrate 902 than for the device layer 904 due to the different doping concentrations of the sacrificial substrate 902 and the device layer 904. The different etch rates may allow for a thickness Td of the device layer 904 to be highly uniform across the device layer (e.g., to have a total thickness variation that it is less than about 500 or 1500 angstroms). In some embodiments, the TTV decreases with the thickness $T_d$ of the device layer 904. For example, the TTV may be less than about 500 angstroms where the thickness $T_d$ of the device layer 904 is less than about 3,000 angstroms, and the TTV may be greater than about 500 angstroms, but less than about 1,500 angstroms, where the thickness $T_d$ of the device layer 904 is more than about 3,000 angstroms.

Figure 15:
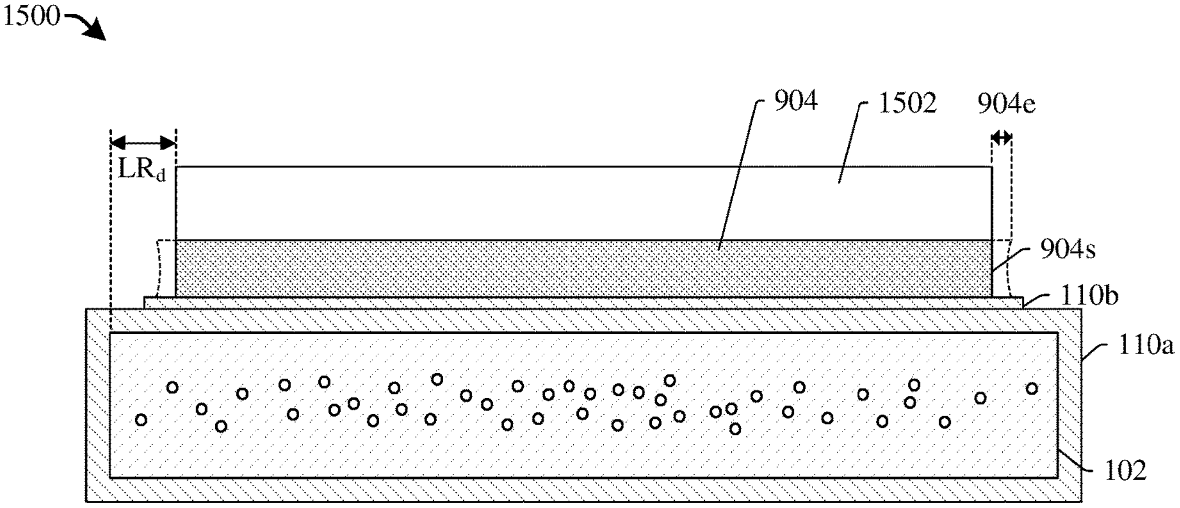

As illustrated by the cross-sectional view 1500 of FIG. 15, the device layer 904 is patterned to remove edge portions 904*e* of the device layer 904. In some embodiments, removing edge portions 904*e* of the device layer 904 laterally removes between approximately 1.4 μm and 2.3 μm of the device layer 904. Removing the edge portions 904*e*, mitigates edge defects from the device layer 904. In some embodiments, the patterning further laterally recesses the sidewalls 904*s* of the device layer 904. In some embodiments, after removing the edge portions 904*e*, the sidewalls 904*s* of the device layer 904 are laterally recessed respectively from sidewalls of the handle substrate 102 by a device lateral recess amount $LR_d$.

In some embodiments, the patterning is performed by etching the device layer 904 according to a mask 1502 that is formed over the device layer 904. The mask 1502 may, for example, be or comprise silicon nitride, silicon oxide, some other hard mask material, photoresist, some other mask material, or any combination of the foregoing. In some embodiments, the mask 1502 may comprise a layer of oxide and an overlying layer of photoresist. In such embodiments, the layer of oxide may be deposited by way of a deposition technique (e.g., PVD, CVD, PE-CVD, or the like) to a thickness of between approximately 100 angstroms and approximately 300 angstroms. The photoresist may be subsequently deposited by a spin coating process to a thickness of between approximately 1 μm and approximately 8 μm. The device layer 94 may be etched by a dry etch or some other etch, and/or may, for example, stop on the first insulating layer 110*a* and the second insulating layer 110*b*. After the patterning process is completed, the mask 1502 may be removed. In some embodiments, a photoresist material within the mask 1502 may be removed by plasma ashing, hydrofluoric acid, or the like. In some embodiments, the mask 1502 may be exposed to $O_2$ plasma (e.g., when mask 1502 is or comprise photoresist). In some embodiments, the mask 1502 may be exposed to hydrofluoric acid for between 120 seconds and 240 seconds (e.g., when mask 1502 is or comprise an oxide).

Figure 16:
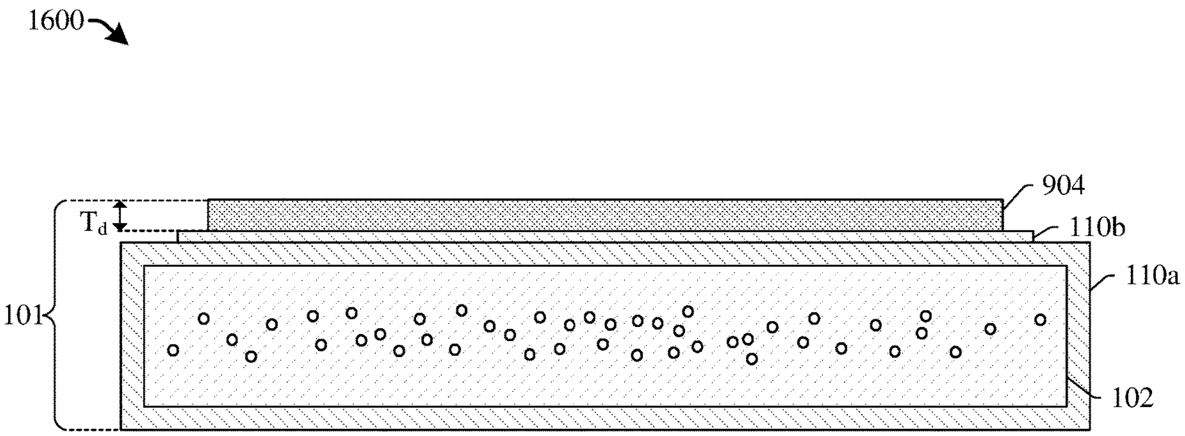

As illustrated by the cross-sectional view 1600 of FIG. 16, a second thinning process is performed into the device layer 904 to reduce the thickness Td of the device layer 904. In various embodiments, the after the second thinning process the device layer 904 may have a thickness Td of about 0.3-8.0 micrometers, about 0.3-4.15 micrometers, or about 4.15-8.0 micrometers, and/or to greater than about 0.3, 1.0, 2.0, 5.0, 8.0 micrometers, or other suitable values. Collectively, the device layer 904, the first insulating layer 110*a*, the second insulating layer 110*b*, and the handle substrate 102 define an SOI substrate 101. In some embodiments, the second thinning process is performed by mechanical grinding, CMP, or the like.

In some embodiments, a fifth wet cleaning process is performed after the second thinning process to remove etch residue and/or other undesired byproducts produced during the patterning. In some embodiments, the fifth wet cleaning process removes oxide that forms on the device layer 904 during the patterning. In some embodiments, fifth wet cleaning process is performed by exposing the device layer 904 to first wet cleaning solution comprising 1% hydrofluoric acid for between approximately 30 seconds and approximately 120 seconds, followed by a second wet cleaning solution comprising deionized water, ammonia water, and aqueous hydrogen peroxide for between approximately 15 seconds and approximately 120 seconds, followed by a third wet cleaning solution comprising deionized water, hydrochloric acid, and aqueous hydrogen peroxide for between approximately 15 seconds and approximately 120 seconds.

Figure 17:
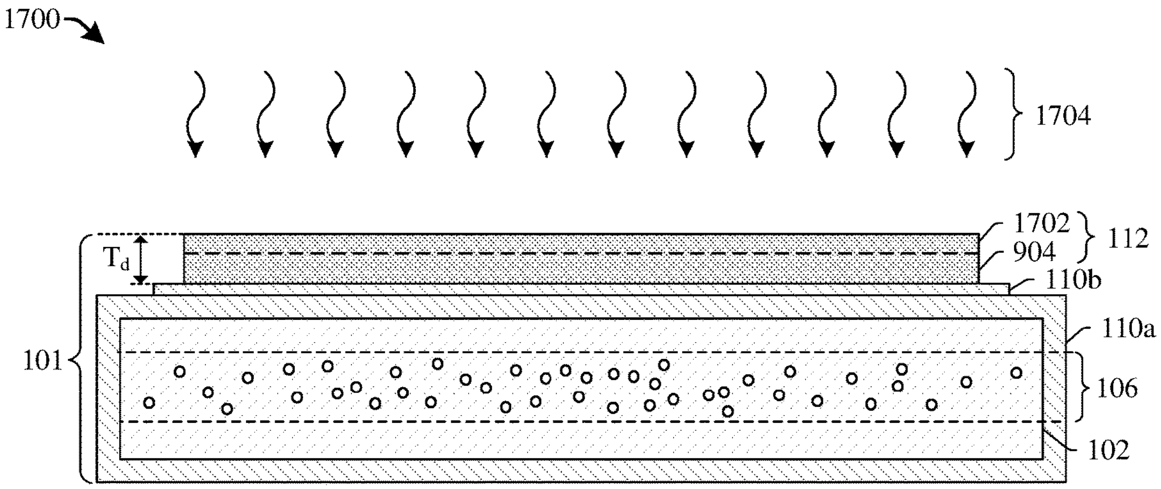

As illustrated by the cross-sectional view 1700 of FIG. 17, an epitaxial process 1704 is performed to form a device layer 112 having an increased thickness. The epitaxial process 1704 forms an epitaxial layer 1702 onto the device layer 904 and form a device layer 112. The epitaxial layer 1702 may be formed to a thickness in a range of between approximately 0.2 μm and approximately 6 μm. The resulting device layer 112 may have a thickness that is between approximately 5 μm and approximately 10 μm. In some embodiments, the epitaxial process may be performed at a temperature in a range of between approximately 1100° C. and approximately 1200° C. Because of the high structure integrity of the handle substrate (due to the relatively high density of BMDs 104 within the central region 106 of the handle substrate 102), the formation of slip lines due to the high temperature of the epitaxial process is prevented.

Figure 18:
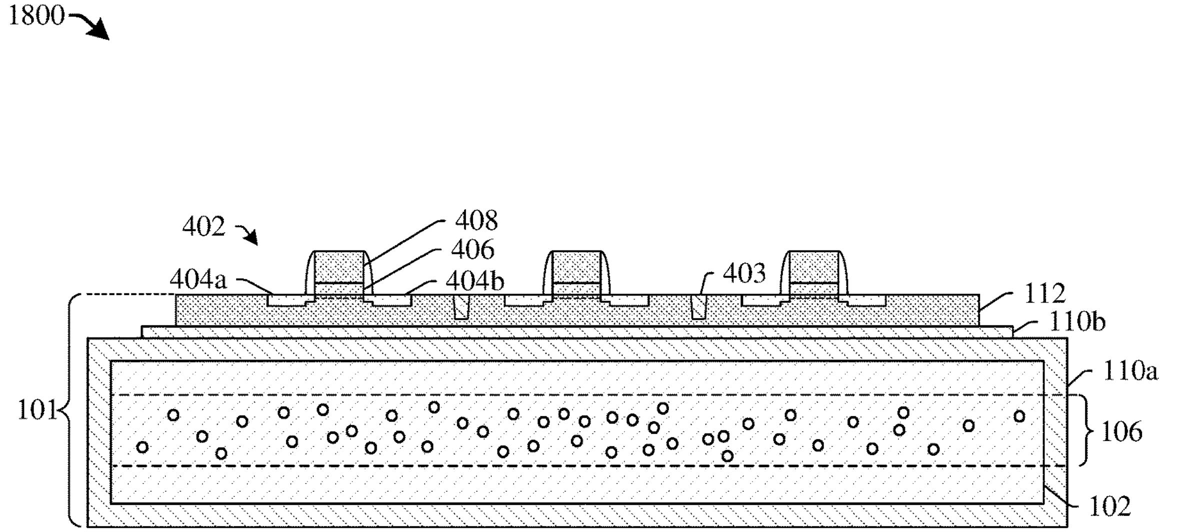

As illustrated by the cross-sectional view 1800 of FIG. 18, a plurality of transistor devices 402 are formed within the device layer 108. In some embodiments, a process for forming the transistor devices 402 comprises depositing a dielectric layer over the device layer 112 and further depositing a conductive layer covering the dielectric layer. The conductive layer and the dielectric layer are patterned (e.g., by a photolithography/etching process) to form a gate electrode 408 and a gate dielectric layer 406. Dopants may be implanted into the device layer 112 with the gate electrode 408 in place to define lightly doped portions of the source/drain regions, 404*a* and 404*b*.

In some embodiments, the plurality of transistor devices 402 may be separated from one another by way of isolation structures 403. In some embodiments, the isolation structures 403 may comprise shallow trench isolation structure (STIs). In such embodiments, the isolation structures 403 may be formed by etching the device layer 112 to define trenches within the device layer 112. The trenches are subsequently filled with one or more dielectric materials. In some embodiments, after etching the device layer 112, a high temperature anneal may be performed to repair damage that occurred during the etching process. In some embodiments, the high temperature anneal may be performed at a temperature of greater than 1000° C. In some embodiments, the high temperature anneal may be performed for a time of greater than 1 hour. Because of the high structural integrity of the handle substrate 102 (due to the relatively high density of BMDs 104 within the central region 106 of the handle substrate 102), the formation of slip lines due to the high temperature of the anneal is prevented.

Figure 19:
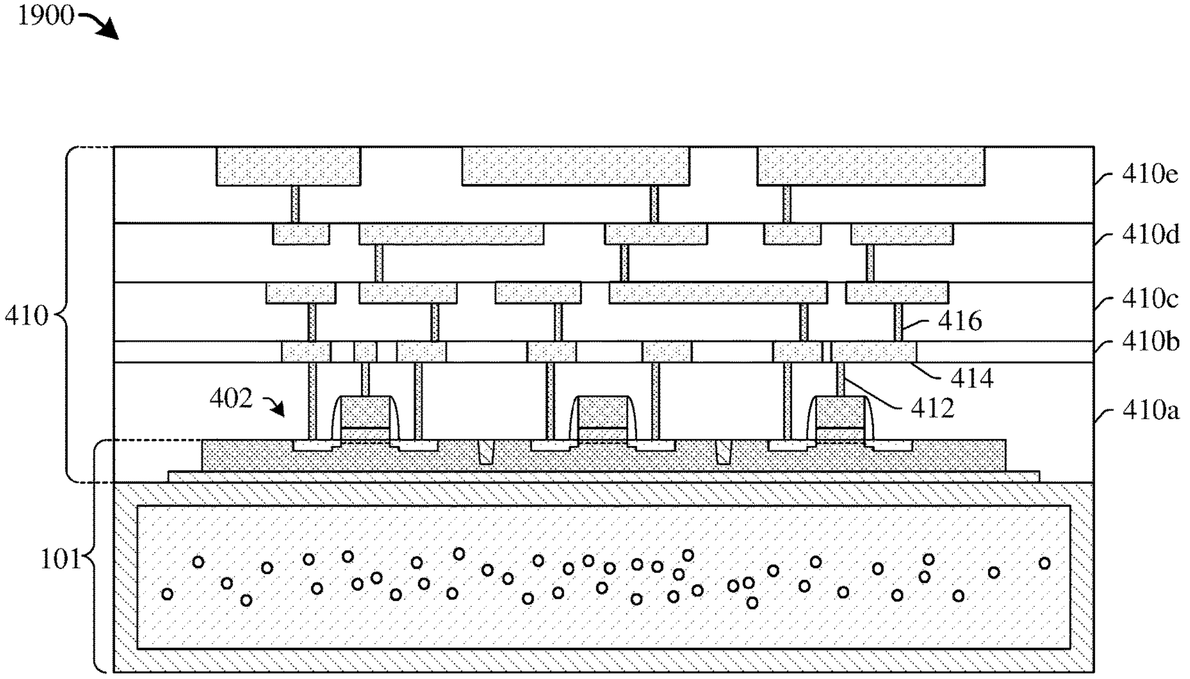

As illustrated by the cross-sectional view 1900 of FIG. 19, a dielectric structure 410 is formed over the device layer 112. A plurality of interconnect layers 412-416 are formed within the dielectric structure 410. In some embodiments, the dielectric structure 410 may comprise a plurality of stacked inter-level dielectric (ILD) layers 410*a*-410*e* formed over the device layer 112. In some embodiments (not shown), the plurality of stacked ILD layers are separated by etch stop layers (not shown). In some embodiments, the plurality of interconnect layers 412-416 may comprise conductive contacts 412, interconnect wires 414, and interconnect vias 416. The plurality of interconnect layers 412-416 may be formed by forming one of the one or more ILD layers (e.g., an oxide, a low-k dielectric, or an ultra low-k dielectric) over the device layer 112, selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization process).

Figure 20:
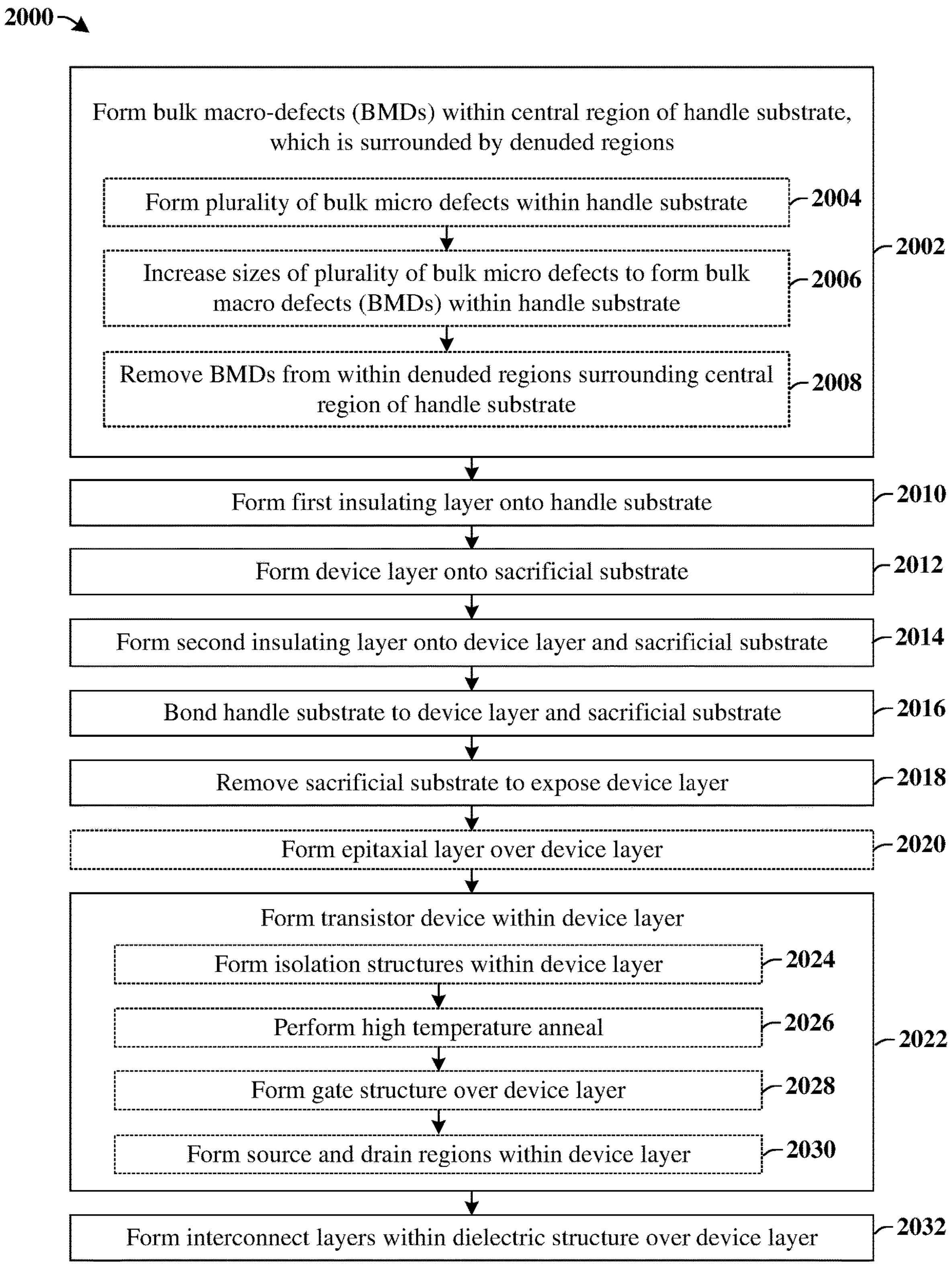
FIG. 20 illustrates a flow diagram of some embodiments of a method of forming an SOI substrate comprising a handle substrate having a central region comprising a plurality of BMDs disposed between denuded regions.

FIG. 20 illustrates a flow diagram of some embodiments of a method 2000 of forming a SOI substrate comprising a handle substrate having a central region comprising a plurality of BMDs disposed between denuded regions.

While method 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a plurality of bulk macro defects are formed within a central region of a handle substrate. The central region of the handle substrate is vertically surrounded by denuded regions that have a concentration of bulk micro defects that is lower than the central region (e.g., approximately equal to zero). In some embodiments, the plurality of bulk macro defects may be formed according to acts 2004-2008.

At 2004, a plurality of bulk micro defects are formed within a handle substrate. FIGS. 6A-6B illustrate cross-sectional views 600-602 of some embodiments corresponding to act 2004. FIGS. 7A-7B illustrate cross-sectional views, 700 and 706, of some alternative embodiments corresponding to act 2004.

At 2006, sizes of the plurality of bulk micro defects are increased to form a plurality of bulk macro defects within the handle substrate. In some embodiments, sizes of the plurality of bulk micro defects may be increased by operating upon the bulk micro defects with a thermal process (e.g., having a temperature greater than approximately 1000° C., greater than approximately 1100° C., or other suitable temperatures). FIG. 6C illustrates a cross-sectional view 610 of some embodiments corresponding to act 2006. FIG. 7C illustrates a cross-sectional view 712 of some alternative embodiments corresponding to act 2006.

At 2008, some of the bulk macro defects are removed from denuded regions disposed along outer surfaces of the handle substrate. FIG. 6D illustrates a cross-sectional view 614 of some embodiments corresponding to act 2008. FIG. 7C illustrates a cross-sectional view 712 of some alternative embodiments corresponding to act 2008.

At 2010, a first insulating layer is formed onto the handle substrate. FIG. 8 illustrates a cross-sectional view 800 of some embodiments corresponding to act 2010.

At 2012, a device layer is formed onto a sacrificial substrate. FIG. 9 illustrates a cross-sectional view 900 of some embodiments corresponding to act 2012.

At 2014, a second insulating layer may be formed onto the sacrificial substrate and the device layer. FIG. 11 illustrates a cross-sectional view 1100 of some embodiments corresponding to act 2014.

At 2016, the handle substrate is bonded to the device layer and the sacrificial substrate. FIG. 12 illustrates a cross-sectional view 1200 of some embodiments corresponding to act 2016.

At 2018, the sacrificial substrate is removed to expose the device layer. FIG. 13 illustrates a cross-sectional view 1300 of some embodiments corresponding to act 2018.

At 2020, an epitaxial layer is formed on the device layer. Forming the epitaxial layer on the device layer forms a device layer with an increased thickness. FIG. 17 illustrates a cross-sectional view 1700 of some embodiments corresponding to act 2020.

At 2022, a transistor device is formed within the device layer. In some embodiments, the transistor devices are formed may be formed according to acts 2024-2028.

At 2024, isolation structures are formed within the device layer. In some embodiments, the isolation structure is formed within a trench etched into the device layer. FIG. 18 illustrates a cross-sectional view 1800 of some embodiments corresponding to act 2024.

At 2026, an anneal process is performed on the device layer. The anneal process repairs damage from etching of the device layer. FIG. 18 illustrates a cross-sectional view 1800 of some embodiments corresponding to act 2026.

At 2028, a gate structure is formed over the device layer. FIG. 18 illustrates a cross-sectional view 1800 of some embodiments corresponding to act 2028.

At 2030, source and drain regions are formed within the device layer. FIG. 18 illustrates a cross-sectional view 1800 of some embodiments corresponding to act 2030.

At 2032, interconnect layers are formed within a dielectric structure over the device layer. FIG. 19 illustrates a cross-sectional view 1900 of some embodiments corresponding to act 2032.

Accordingly, in some embodiments, the present disclosure relates to a method of forming a semiconductor on insulator (SOI) substrate having a handle substrate with a high structural integrity that minimizes undesirable wafer distortion (warpage). The SOI substrate comprises a handle substrate having a central region with a relatively high concentration bulk macro defects (BMDs). The relatively high concentration (e.g., greater than approximately $1\times10^8$ BMDs/$cm^3$) and large sizes (e.g., greater than approximately 2 nm) of the BMDs cause the handle wafer to have a less warpage (e.g., a greater stiffness) due to oxide and/or air within the BMDs.

In some embodiments, the present disclosure relates to a method of forming a semiconductor structure. The method includes forming a plurality of bulk micro defects within a handle substrate; increasing sizes of the plurality of bulk micro defects to form a plurality of bulk macro defects (BMDs) within the handle substrate; removing some of the plurality of BMDs from within a first denuded region and a second denuded region arranged along opposing surfaces of the handle substrate; forming an insulating layer onto the handle substrate; and forming a device layer having a semiconductor material onto the insulating layer; the first denuded region and the second denuded region vertically surrounding a central region of the handle substrate that has a higher concentration of the plurality of BMDs than both the first denuded region and the second denuded region. In some embodiments, the plurality of BMDs have first sizes that are between approximately 1,000% and approximately 20,000% larger than second sizes of the plurality of bulk micro defects. In some embodiments, the plurality of BMDs respectively have a size that is between approximately 3 nm and approximately 100 nm. In some embodiments, the method further includes performing a first thermal process on the handle substrate to form the plurality of bulk micro defects; and performing a second thermal process on the handle substrate to increase the sizes of the plurality of bulk micro defects within the handle substrate to form the plurality of BMDs. In some embodiments, the first thermal process is performed at a maximum first temperature and the second thermal process is performed at a maximum second temperature that is larger than the maximum first temperature. In some embodiments, the method further includes exposing the handle substrate to an environment having an argon gas or a hydrogen gas to remove some of the plurality of BMDs from the handle substrate and to form the first denuded region and the second denuded region. In some embodiments, the central region has a concentration of BMDs that is between approximately $8\times10^8$ BMDs/$cm^3$ and approximately $9\times10^9$ BMDs/$cm^3$. In some embodiments, the method further includes performing a first thermal process on the handle substrate to increase a number of bulk micro defect within the handle substrate from a first non-zero number to a second non-zero number; and performing a second thermal process on the handle substrate to increase the sizes of the plurality of bulk micro defects within the handle substrate to form the plurality of BMDs. In some embodiments, the method further includes forming the device layer on a sacrificial substrate; performing a bonding process to bond the device layer and the sacrificial substrate to the handle substrate; and removing the sacrificial substrate from the device layer after performing the bonding process. In some embodiments, the insulating layer is formed to continuously extend around outer edges of the handle substrate.

In other embodiments, the present disclosure relates to a method of forming a semiconductor-on-insulator (SOI) substrate. The method includes performing a first thermal process to form a plurality of bulk micro defects within a handle substrate; performing a second thermal process to form a plurality of bulk macro defects (BMDs) within the handle substrate by increasing sizes of the plurality of bulk micro defects; performing a third thermal process to remove some of the plurality of BMDs from within a first denuded region and a second denuded region arranged along opposing surfaces of the handle substrate; forming an insulating layer onto the handle substrate; and forming a device layer having a semiconductor material onto the insulating layer. In some embodiments, the first denuded region and the second denuded region vertically surround a central region having a higher concentration of BMDs than the first denuded region and the second denuded region. In some embodiments, the first thermal process is performed at a first temperature in a first range of between approximately 500° C. and approximately 800° C., the second thermal process is performed at a second temperature in a second range of between approximately 1050° C. and approximately 1150° C., and the third thermal process is performed at a third temperature in a third range of between approximately 1100° C. and approximately 1200° C. In some embodiments, the first denuded region and the second denuded region respectively extend into the handle substrate to depths that are in a range of between approximately 50 nanometers (nm) and approximately 100 microns. In some embodiments, the second thermal process and the third thermal process are a same thermal process.

In yet other embodiments, the present disclosure relates to a semiconductor structure. The semiconductor structure includes a handle substrate having a plurality of bulk macro defects (BMDs); an insulating layer disposed onto a top surface of the handle substrate; and a device layer having a semiconductor material disposed onto the insulating layer; the handle substrate having a first denuded region and a second denuded region that vertically surround a central region of the handle substrate that has a higher concentration of the plurality of BMDs than both the first denuded region and the second denuded region. In some embodiments, the plurality of BMDs respectively have a size that is larger than approximately 5 nm. In some embodiments, the central region laterally extends between a first outermost sidewall of the handle substrate and a second outermost sidewall of the handle substrate. In some embodiments, the central region has a concentration of BMDs that is between approximately $8\times10^8$ BMDs/cm$^3$ and approximately $9\times10^9$ BMDs/cm$^3$. In some embodiments, the central region laterally extends past opposing outermost sidewalls of the device layer by non-zero distances.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a handle substrate comprising a plurality of bulk macro defects (BMDs);

an insulating structure disposed onto a top surface of the handle substrate;

a device layer comprising a semiconductor material disposed onto the insulating structure;

wherein the handle substrate has a first denuded region and a second denuded region that vertically surround a central region of the handle substrate that has a higher concentration of the plurality of BMDs than both the first denuded region and the second denuded region, wherein the central region laterally extends between a first outermost sidewall of the handle substrate and a second outermost sidewall of the handle substrate; and wherein the insulating structure has a greater thickness at a center of the insulating structure than along outermost sidewalls of the insulating structure, the insulating structure comprising a topmost surface below the device layer and a sidewall that is laterally between and separated by non-zero lateral distances from outermost sidewalls of the device layer and the handle substrate that face a same direction and that is vertically confined between horizontally extending surfaces of the handle substrate and the device layer that face each other.

2. The semiconductor structure of claim 1, wherein the plurality of BMDs respectively have a size that is larger than approximately 5 nanometers.

3. The semiconductor structure of claim 1, wherein the concentration of the plurality of BMDs is between approximately $8\times10^8$ BMDs/cm$^3$ and approximately $9\times10^9$ BMDs/cm$^3$.

4. The semiconductor structure of claim 1, wherein the higher concentration of the plurality of BMDs within the central region laterally extends past the outermost sidewalls of the device layer by non-zero distances.

5. The semiconductor structure of claim 1, wherein the first denuded region and the second denuded region respectively have a thickness that is in a range of between approximately 0.05 microns and approximately 50 microns.

6. The semiconductor structure of claim 1, wherein the insulating structure separates the handle substrate from the device layer.

7. The semiconductor structure of claim 1, wherein the insulating structure has a first upper surface within a central region of the insulating structure and a second upper surface that is below the first upper surface and that is within a peripheral region of the insulating structure surrounding the central region, the first upper surface and the second upper surface both facing a same direction and both facing away from the handle substrate.

8. The semiconductor structure of claim 1, wherein the thickness of the insulating structure at the center of the insulating structure is measured perpendicular to the top surface of the handle substrate and the thickness of the insulating structure along the outermost sidewalls of the insulating structure is measured perpendicular to the first outermost sidewall or the second outermost sidewall of the handle substrate.

9. The semiconductor structure of claim 1, wherein the plurality of BMDs respectively have sizes that are in a range of between approximately 3 nanometers (nm) and approximately 100 nm.

10. A semiconductor-on-insulator (SOI) substrate, comprising:

a plurality of bulk macro defects (BMDs) disposed within a central region of a substrate, wherein the substrate further comprises a first denuded region and a second denuded region arranged between the central region and opposing surfaces of the substrate, the central region having a higher concentration of the plurality of BMDs than the first denuded region and the second denuded region;

a first insulating layer disposed along multiple outermost surfaces of the substrate;

a second insulating layer disposed onto the first insulating layer, wherein the first insulating layer laterally extends past opposing outermost sidewalls of the second insulating layer and wherein the first insulating layer and the second insulating layer collectively form a stepped insulating structure over a first side of the substrate; and a device layer disposed on the second insulating layer, wherein the plurality of BMDs laterally extend past opposing outermost sidewalls of the device layer.

11. The SOI substrate of claim 10, wherein the concentration of the plurality of BMDs within the central region of the substrate is between approximately $8\times10^{8}$ BMDs/cm$^{3}$ and approximately $9\times10^{9}$ BMDs/cm$^{3}$.

12. The SOI substrate of claim 10, further comprising:

one or more transistor devices disposed within the device layer.

13. The SOI substrate of claim 10, wherein the stepped insulating structure comprises a sidewall that is entirely below the device layer and that is laterally between and separated by non-zero distances from one of the opposing outermost sidewalls of the device layer and an outermost sidewall of the substrate that face a same direction.

14. The SOI substrate of claim 10, wherein the second insulating layer is disposed onto a top surface of the first insulating layer that faces away from the substrate.

15. The SOI substrate of claim 10, wherein the first denuded region extends into the substrate to a first depth that is sufficiently small to provide the substrate with a rigidity that prevents warpage of the substrate.

16. A semiconductor-on-insulator (SOI) substrate, comprising:

a substrate comprising a central region disposed between a first denuded region and a second denuded region, wherein the central region has a higher concentration of a plurality of BMDs than both the first denuded region and the second denuded region, wherein the plurality of BMDs respectively have sizes that are in a range of between approximately 3 nanometers (nm) and approximately 100 nm;

an insulating structure disposed on a first side of the substrate, wherein the first denuded region separates the insulating structure from the central region;

a semiconductor material disposed on the insulating structure, wherein the insulating structure separates the substrate from the semiconductor material and wherein the higher concentration of the plurality of BMDs within the central region laterally extends past opposing outermost sidewalls of the semiconductor material by non-zero distances; and one or more semiconductor devices disposed within the semiconductor material.

17. The SOI substrate of claim 16, wherein the insulating structure is also arranged on a second side of the substrate opposing the first side, wherein the insulating structure has a larger thickness along the first side than along the second side.

18. The SOI substrate of claim 16, wherein a concentration of the plurality of BMDs within the central region is in a range of between approximately $8 \text{ x } 10^{8}$ BMDs/cm$^{3}$ and approximately $9\times10^{9}$ BMDs/cm$^{3}$.

19. The SOI substrate of claim 16, wherein the insulating structure has an outer sidewall that is laterally between an outermost sidewall of the insulating structure and a first outermost sidewall of the opposing outermost sidewalls of the semiconductor material; and wherein the outer sidewall, the outermost sidewall of the insulating structure, and the first outermost sidewall of the semiconductor material facing a same direction.

20. The SOI substrate of claim 16, wherein the insulating structure laterally extends past the opposing outermost sidewalls of the semiconductor material.

* * * * *